(12) United States Patent
Horie et al.

(10) Patent No.: US 9,984,260 B2
(45) Date of Patent: May 29, 2018

(54) IC TAG ISSUING APPARATUS

(71) Applicant: SATO HOLDINGS KABUSHIKI KAISHA, Tokyo (JP)

(72) Inventors: Takashi Horie, Ibaraki (JP); Atsushi Watanabe, Saitama (JP)

(73) Assignee: SATO HOLDINGS KABUSHIKI KAISHA, Tokyo (JP)

( * ) Notice: Subject to any disclaimer, the term of this patent is extended or adjusted under 35 U.S.C. 154(b) by 76 days.

(21) Appl. No.: 15/126,398

(22) PCT Filed: Jul. 28, 2014

(86) PCT No.: PCT/JP2014/069836
§ 371 (c)(1),
(2) Date: Sep. 15, 2016

(87) PCT Pub. No.: WO2015/151303
PCT Pub. Date: Oct. 8, 2015

(65) Prior Publication Data
US 2017/0091495 A1    Mar. 30, 2017

(30) Foreign Application Priority Data
Mar. 31, 2014  (JP) .................. 2014-072565

(51) Int. Cl.
*H05K 1/00* (2006.01)
*G06K 7/10* (2006.01)
(Continued)

(52) U.S. Cl.
CPC ... *G06K 7/10198* (2013.01); *G06K 19/07777* (2013.01); *H05K 1/00* (2013.01); *H05K 1/18* (2013.01)

(58) Field of Classification Search
CPC .......... G06K 19/077; G06K 7/10; H05K 1/00; H05K 1/18; H05K 3/00; H05K 3/0097
See application file for complete search history.

(56) References Cited

U.S. PATENT DOCUMENTS

2006/0237536 A1* 10/2006 Shiigi ................ G06K 7/10336
235/439
2007/0216525 A1*  9/2007 Toshiaki .................. G06K 5/02
340/500
(Continued)

FOREIGN PATENT DOCUMENTS

EP     2 107 510 A1   10/2009
JP     2006-338179 A  12/2006

*Primary Examiner* — Carlos E Garcia
(74) *Attorney, Agent, or Firm* — Foley & Lardner LLP

(57) ABSTRACT

An IC tag issuing apparatus for writing identification data to IC tags, the IC tags arranged in multiple rows aligned as an IC tag continuous body, and issuing the result, the IC tags issuing apparatus including second antenna units arranged to face each row of the IC tags arranged in multiple rows, respectively, and functioning as a plurality of writing row antenna units for writing the identification data to the IC tags by the electromagnetic induction method and a third antenna unit arranged at a downstream side in the conveyance direction of the IC tag continuous body from the second antenna unit and functioning as an electric-wave type antenna unit for writing the identification data to the IC tags by the electric wave method and constituted to write the identification data by using the third antenna unit to the IC tag in which the identification data could not be written by using the second antenna unit.

12 Claims, 16 Drawing Sheets

(51) Int. Cl.
*G06K 19/077* (2006.01)
*H05K 1/18* (2006.01)

(56) References Cited

U.S. PATENT DOCUMENTS

2008/0042168 A1* 2/2008 Watanabe ........... B32B 37/0053
 257/204
2017/0213113 A1* 7/2017 Miura .................. G06K 13/073

* cited by examiner

| IDENTIFICATION DATA | | PRINT DATA | | | TAG ID |
|---|---|---|---|---|---|
| MANAGEMENT NUMBER | **** | PRODUCT NUMBER | PRODUCT NAME | **** | |
| A00001 | | W00001 | SHIRT | | |
| A00002 | | W00001 | SHIRT | | |
| A00003 | | W00001 | SHIRT | | |
| A00004 | | W00001 | SHIRT | | |
| A00005 | | W00001 | SHIRT | | |
| A00006 | | W00001 | SHIRT | | |
| A00007 | | W00001 | SHIRT | | |
| A00008 | | W00001 | SHIRT | | |
| A00009 | | W00001 | SHIRT | | |
| A00010 | | W00001 | SHIRT | | |
| A00011 | | W00101 | SWEATER | | |
| A00012 | | W00101 | SWEATER | | |
| A00013 | | W00101 | SWEATER | | |
| A00014 | | W00101 | SWEATER | | |
| A00015 | | W00101 | SWEATER | | |
| A00016 | | W00101 | SWEATER | | |
| A00017 | | W00101 | SWEATER | | |
| A00018 | | W00101 | SWEATER | | |
| A00019 | | W00101 | SWEATER | | |
| A00020 | | W00101 | SWEATER | | |
| A00021 | | W00101 | SWEATER | | |
| | | | SWEATER | | |

FIG.14A

| IDENTIFICATION DATA | | PRINT DATA | | | TAG ID |
|---|---|---|---|---|---|
| MANAGEMENT NUMBER | **** | PRODUCT NUMBER | PRODUCT NAME | **** | |
| A00001 | | W00001 | SHIRT | | 123123 |
| A00002 | | W00001 | SHIRT | | 123103 |
| A00003 | | W00001 | SHIRT | | 123223 |
| A00004 | | W00001 | SHIRT | | 120003 |
| A00005 | | W00001 | SHIRT | | |
| A00006 | | W00001 | SHIRT | | 126323 |
| A00007 | | W00001 | SHIRT | | 123753 |
| A00008 | | W00001 | SHIRT | | 123653 |
| A00009 | | W00001 | SHIRT | | 129563 |
| A00010 | | W00001 | SHIRT | | 123341 |
| A00011 | | W00101 | SWEATER | | 123368 |
| A00012 | | W00101 | SWEATER | | 126544 |
| A00013 | | W00101 | SWEATER | | 123651 |
| A00014 | | W00101 | SWEATER | | 111112 |
| A00015 | | W00101 | SWEATER | | 123795 |
| A00016 | | W00101 | SWEATER | | 126313 |
| A00017 | | W00101 | SWEATER | | 123424 |
| A00018 | | W00101 | SWEATER | | 122155 |
| A00019 | | W00101 | SWEATER | | 127632 |
| A00020 | | W00101 | SWEATER | | |
| A00021 | | W00101 | SWEATER | | |
| | | | SWEATER | | |

FIG.14B

| MATRIX INFORMATION | | TAG ID | IDENTIFICATION DATA | | PRINT DATA | | |
|---|---|---|---|---|---|---|---|
| LINE | ROW | | MANAGEMENT NUMBER | .... | PRODUCT NUMBER | PRODUCT NAME | .... |
| 1 | 1 | 123123 | A00001 | | W00001 | SHIRT | |
| 1 | 2 | 123103 | A00002 | | W00001 | SHIRT | |
| 1 | 3 | 123223 | A00003 | | W00001 | SHIRT | |
| 1 | 4 | 120003 | A00004 | | W00001 | SHIRT | |
| 1 | 5 | 120000 | A00005 | | W00001 | SHIRT | |
| 1 | 6 | 126323 | A00006 | | W00001 | SHIRT | |
| 1 | 7 | 123753 | A00007 | | W00001 | SHIRT | |
| 1 | 8 | 123653 | A00008 | | W00001 | SHIRT | |
| 1 | 9 | 129663 | A00009 | | W00001 | SHIRT | |
| 1 | 10 | 123341 | A00010 | | W00001 | SHIRT | |
| 2 | 1 | | | | | | |
| 2 | 2 | 123368 | A00011 | | W00101 | SWEATER | |
| 2 | 3 | 126544 | A00012 | | W00101 | SWEATER | |
| 2 | 4 | 123651 | A00013 | | W00101 | SWEATER | |
| 2 | 5 | 111112 | A00014 | | W00101 | SWEATER | |
| 2 | 6 | 123795 | A00015 | | W00101 | SWEATER | |
| 2 | 7 | 126313 | A00016 | | W00101 | SWEATER | |
| 2 | 8 | 123424 | A00017 | | W00101 | SWEATER | |
| 2 | 9 | 122155 | A00018 | | W00101 | SWEATER | |
| 2 | 10 | 127632 | A00019 | | W00101 | SWEATER | |

FIG.15A

| IDENTIFICATION DATA | | PRINT DATA | | |
|---|---|---|---|---|
| MANAGEMENT NUMBER | .... | PRODUCT NUMBER | PRODUCT NAME | .... |
| A00005 | | W00001 | SHIRT | |
| | | | | |
| | | | | |
| | | | | |
| | | | | |
| | | | | |
| | | | | |

FIG.15B

| MATRIX INFORMATION | | TAG ID | IDEN |
|---|---|---|---|
| LINE | ROW | | MAN |
| 1 | 1 | 123123 | |
| 1 | 2 | | |
| 1 | 3 | 123223 | |
| 1 | 4 | | |
| 1 | 5 | 120000 | |
| 1 | 6 | | |
| 1 | 7 | 123753 | |
| 1 | 8 | | |
| 1 | 9 | 129663 | |
| 1 | 10 | | |
| 2 | 1 | | |
| 2 | 2 | | |
| 2 | 3 | | |
| 2 | 4 | | |
| 2 | 5 | | |
| 2 | 6 | | |
| 2 | 7 | | |
| 2 | 8 | | |
| 2 | 9 | | |
| 2 | 10 | | |

FIG.17A

| MATRIX INFORMATION | | TAG ID | IDENTIFICATION DATA | | PRINT DATA | | |
|---|---|---|---|---|---|---|---|
| LINE | ROW | | MANAGEMENT NUMBER | **** | PRODUCT NUMBER | PRODUCT NAME | **** |
| 1 | 1 | 123123 | A00001 | | W00001 | SHIRT | |
| 1 | 2 | 123103 | A00002 | | W00001 | SHIRT | |
| 1 | 3 | 123223 | A00003 | | W00001 | SHIRT | |
| 1 | 4 | 120003 | A00004 | | W00001 | SHIRT | |
| 1 | 5 | 120000 | A00005 | | W00001 | SHIRT | |
| 1 | 6 | 126323 | A00006 | | W00001 | SHIRT | |
| 1 | 7 | 123753 | A00007 | | W00001 | SHIRT | |
| 1 | 8 | 123653 | A00008 | | W00001 | SHIRT | |
| 1 | 9 | 129663 | A00009 | | W00001 | SHIRT | |
| 1 | 10 | 123341 | A00010 | | W00001 | SHIRT | |
| 2 | 1 | | | | | | |
| 2 | 2 | | | | | | |
| 2 | 3 | | | | | | |
| 2 | 4 | | | | | | |
| 2 | 5 | | | | | | |
| 2 | 6 | | | | | | |
| 2 | 7 | | | | | | |
| 2 | 8 | | | | | | |
| 2 | 9 | | | | | | |
| 2 | 10 | | | | | | |

FIG.17B

IC TAG ISSUING APPARATUS

TECHNICAL FIELD

The present invention relates to an IC tag issuing apparatus writing desired identification data to each of IC tags of an IC tag continuous body on which the IC tags are aligned in multiple rows in a non-contact manner and issuing it.

BACKGROUND ART

In recent years, technologies for facilitating inventory control, sales control and the like of merchandises by an RFID (radio frequency identification) using an IC tag having an IC chip and an antenna and making electric writing/reading of information in a non-contact manner possible is proposed. The IC chip and the antenna are contained in a sheet such as a label, a price tag and the like as an inlay (inlet) formed on a film in general, and an IC tag is configured. The inlay itself including the IC chip and the antenna is also called an IC tag, an electronic tag, a wireless tag and an RFID tag in some cases but in this Description, a sheet such as a merchandise tag (price tag), a label and the like including the IC chip and the antenna is called an IC tag.

The IC tag is offered as an IC tag continuous body on which the IC tags are continuously aligned in general in many cases, and an IC tag issuing apparatus which writes desired data such as a product number to the IC tag continuous body in a non-contact manner and applies printing of data of the product or a producer or a barcode obtained by coding it or the like on a surface of each of them and issues the result is proposed (see Patent Literature 1, for example).

CITATION LIST

Patent Literature

Patent Literature 1: Japanese Patent Laid-Open No. 2006-338179

SUMMARY OF INVENTION

Problems to be Solved by Invention

In recent years, usage of the IC tags has increased, and needs for a large quantity of issuance of the IC tags at a high speed has heightened. In order to improve an issuance speed of the IC tag, a conveyance speed of an IC tag continuous body needs to be increased, but a speed of communication with the IC tag has limitation, and if the issuance speed is improved by increasing the conveyance speed of the IC tag continuous body, defective writing to the IC tag occurs, and yield is worsened, which is a problem.

An object of the present invention is to solve the problem of the prior-art technology in view of the problem and to provide an IC tag issuing apparatus capable of executing communication processing with the IC tag at a high speed and reliably and of improving the issuance speed.

Means for Solving the Problem

The present invention solves the problem by means for solving below.

An IC tag issuing apparatus of the present invention is an IC tag issuing apparatus for writing identification data to IC tags, the IC tags arranged in multiple rows aligned as an IC tag continuous body, and issuing the result, the IC tag issuing apparatus including a plurality of writing row antenna units arranged to face each roe of the IC tags arranged in multiple rows, respectively, for writing the identification data to the IC tag by an electromagnetic induction method and an electric-wave type antenna unit arranged at a downstream side in a conveyance direction of the IC tag continuous body from the plurality of writing row antenna units for writing the identification data to the IC tags by an electric wave method, characterized in that the identification data is written by using the electric-wave type antenna unit to the IC tags to which the identification data could not be written by using the plurality of writing row antenna units.

Moreover, in the IC tag issuing apparatus of the present invention, further including at an upstream side in the conveyance direction of the IC tag continuous body from the plurality of writing row antenna units, a plurality of reading row antenna units arranged to face each roe of the IC tags arranged in multiple rows, respectively, and read a unique tag ID from the IC tag by the electromagnetic induction method may be provided, and the identification data may be written by using the plurality of writing row antenna units to the IC tags from which the tag ID could be read by using the plurality of reading row antenna units.

Moreover, in the IC tag issuing apparatus of the present invention, the writing of the identification data using the electric-wave type antenna unit may be conducted by specifying the tag ID.

Moreover, in the IC tag issuing apparatus of the present invention, in the writing row antenna unit, surfaces other than the surface faced with the IC tag of the IC tag continuous body may be electromagnetically shielded.

Moreover, in the IC tag issuing apparatus of the present invention, a conveyance unit for conveying the IC tag continuous body while suctioning it to a conveyance belt may be provided, and the writing row antenna unit and the electric-wave type antenna unit may be arranged to face each row of the IC tags of the IC tag continuous body conveyed by the conveyance unit.

Advantageous Effect of the Invention

According to the present invention, such an effect that the communication processing with the IC tag can be executed at a high speed, and the issuance speed can be improved is exerted.

BRIEF DESCRIPTION OF DRAWINGS

FIG. 14A is a view illustrating a product information example stored in an information storage unit illustrated in FIG. 13.

FIG. 14B is a view illustrating a product information example stored in an information storage unit illustrated in FIG. 13.

FIG. 15A is a view illustrating a page information example stored in an information storage unit illustrated in FIG. 13.

FIG. 15B is a reissuance information example stored in an information storage unit illustrated in FIG. 13.

FIG. 17A is a view illustrating a state in which the tag IDs are successfully read from all the IC tags 10 on the odd-number rows on the first line.

FIG. 17B is a view illustrating a state in which the tag IDs are successfully read also from all the IC tags 10 on the even-number rows on the first line.

DESCRIPTION OF EMBODIMENTS

Figure 1:
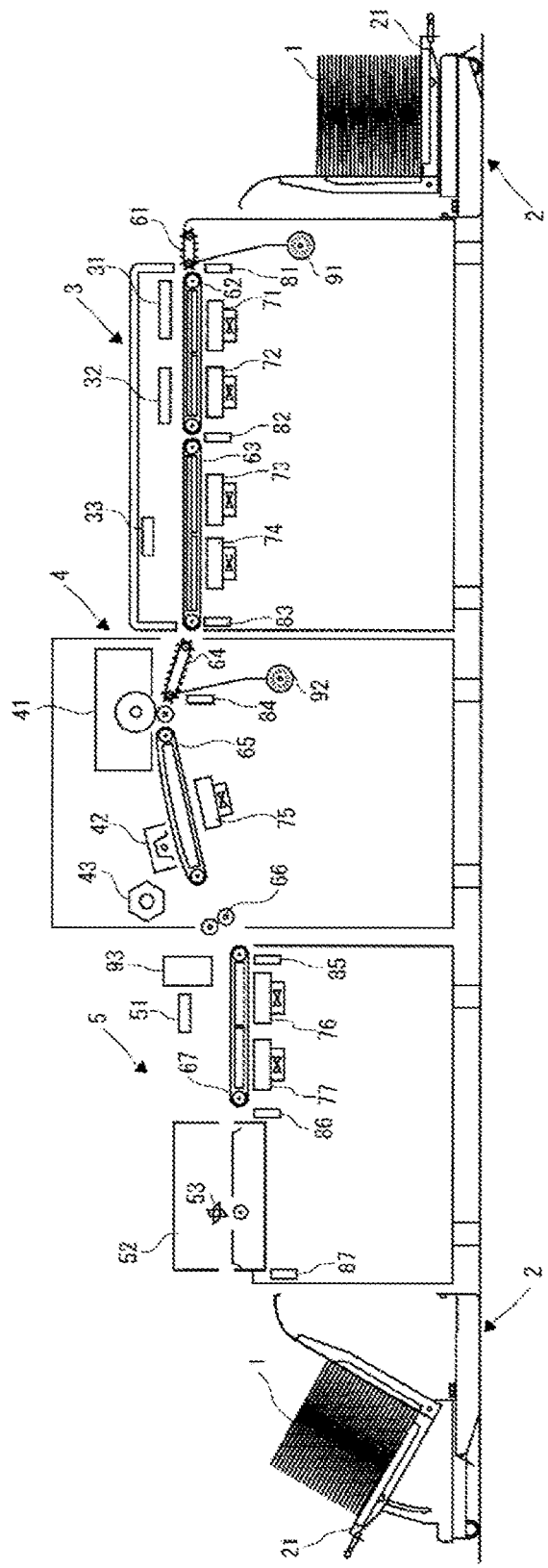
FIG. 1 is a schematic side view illustrating configuration of an embodiment of an IC tag issuing apparatus according to the present invention.

An IC tag issuing apparatus of this embodiment writes desired data in each of IC chips of an IC tag continuous body 1 in a non-contact manner and also applies printing of information of a product or a producer, a barcode obtained by coding it or the like on the respective surfaces and issues the result. The IC tag issuing apparatus includes a placing base 2 on which the IC tag continuous body 1 before issuance is placed, a pre-processing device 3, a printing device 4, a post-processing device 5, and the placing base 2 on which the issued IC tag continuous body 1 is placed by referring to FIG. 1.

Figure 2:
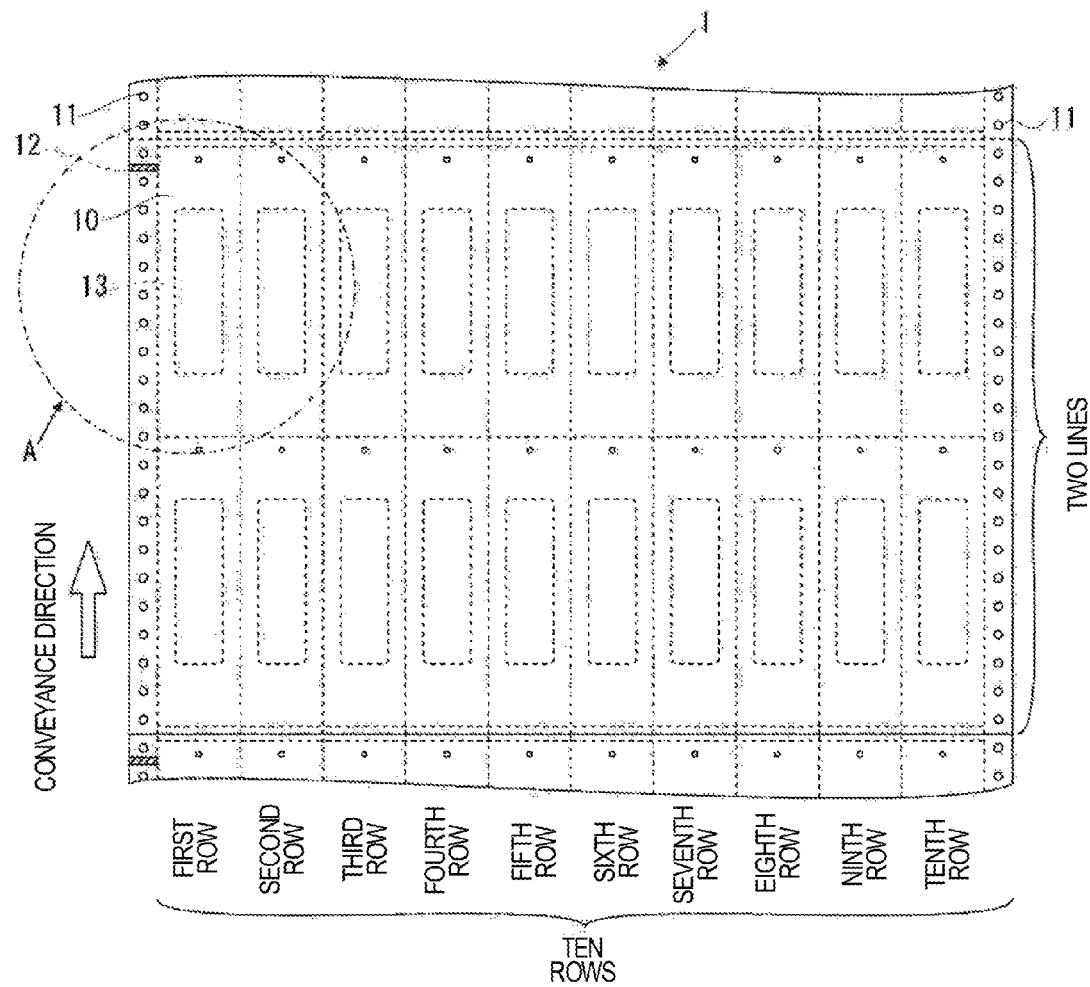
FIG. 2 is a top view illustrating configuration of a part of an IC tag continuous body illustrated in FIG. 1.

The IC tag continuous body 1 is a continuous sheet (fan-folded sheet) in which a page on which IC tags 10 are aligned in multiple rows is folded alternately by referring to FIG. 2. In this embodiment, 20 pieces, that is, 10 pieces*2 lines of the IC tags 10 from a first row to a tenth row are arranged on one page. On both sides of the IC tag continuous body 1, sprocket holes 11 are formed at an equal interval. Moreover, in the vicinity of a head of a conveyance direction in a region in which the sprocket holes 11 are formed, a detection mark 12 indicating start of the page is printed. The IC tag continuous body 1 may be a rolled sheet wound in a roll state and in this case, the detection mark 12 indicating the start of the IC tag 10 only needs to be printed on every line.

Figure 3A:
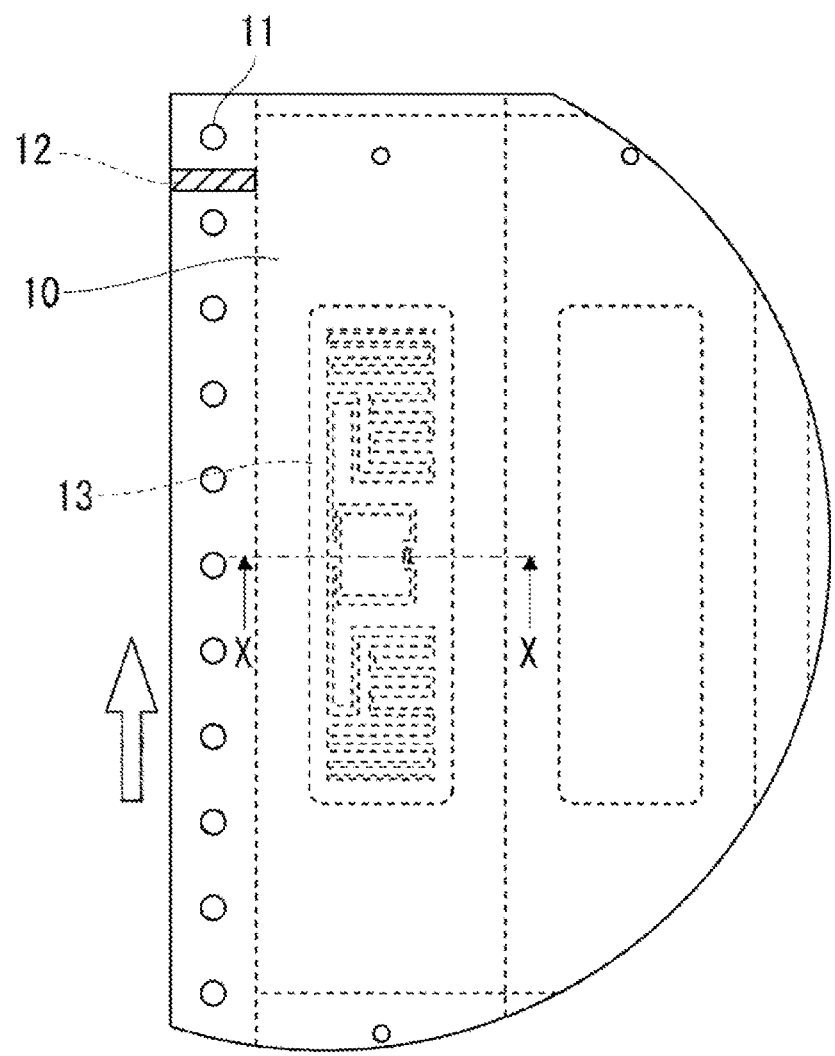
FIG. 3A is an enlarged front view illustrating configuration of an IC tag illustrated in FIG. 2.
Figure 3B:
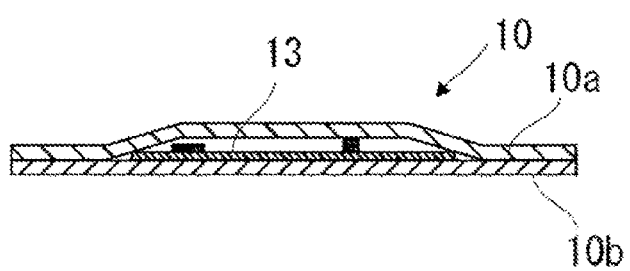
FIG. 3B is an X-X sectional view indicated in FIG. 3A.

By referring to FIG. 3A, the IC tag 10 contains an inlay 13. The FIG. 3A is an enlarged front view of a region indicated by an arrow A in FIG. 2 and FIG. 3B is an X-X sectional view indicated in FIG. 3A. The IC tag 10 of this embodiment is a merchandise tag and as illustrated in FIG. 3B, the inlay 13 is contained by being interposed between a front sheet 10a and a back sheet 10b.

Figure 4:
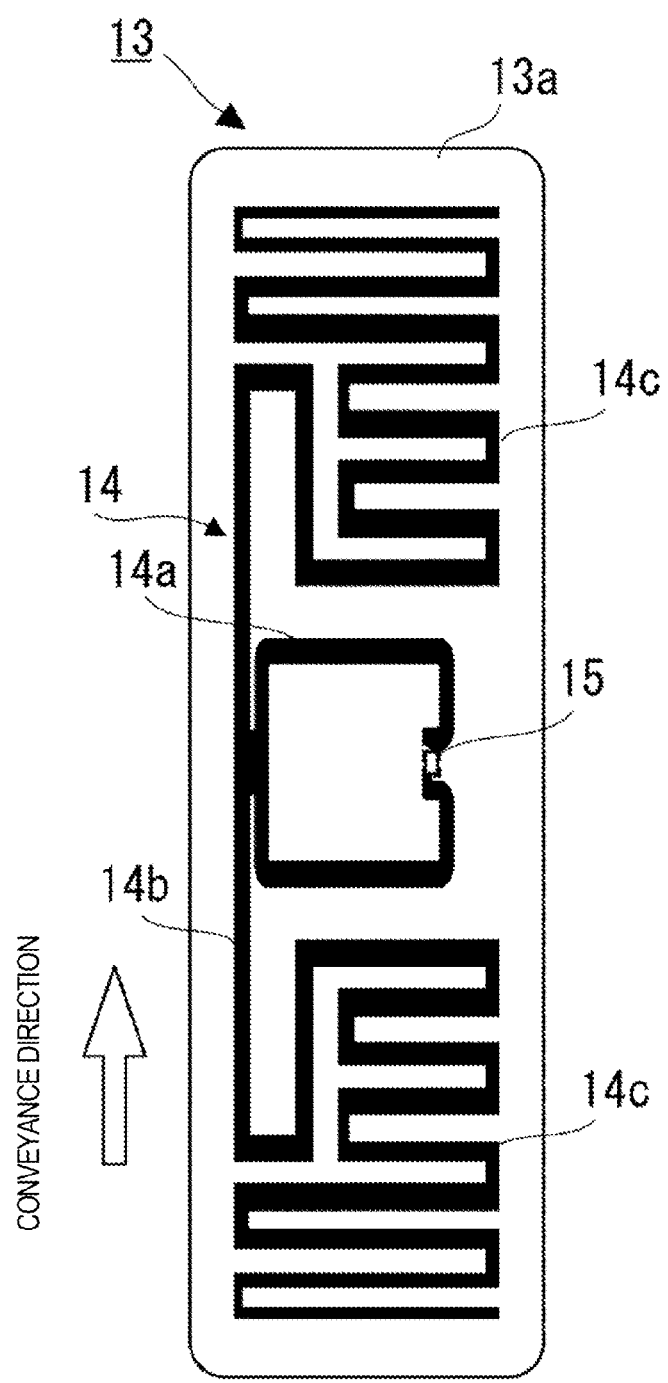
FIG. 4 is a front view illustrating configuration of inlay illustrated in FIG. 3.

The inlay 13 is, by referring to FIGS. 3B and 4, constituted by a base material 13a, an antenna 14, and an IC chip 15. Regarding the inlay 13, the base material 13a is constituted by a synthetic resin film, and a linear antenna 14 made of a conductor is formed on the base material 13a and then, an IC chip 15 is bonded on this antenna 14 by using an electrically conductive adhesive, for example. The antenna 14 has an elongated shape with a conveyance direction as its longitudinal direction, and a loop-shaped antenna element 14a is provided at a center part in the longitudinal direction. And a dipole antenna element 14b connected to the loop-shaped antenna element 14a and extending linearly toward both front and rear ends in the longitudinal direction is provided. Moreover, a meander line antenna element 14c connected to the dipole antenna element 14b and configured to be folded in a zigzag manner in a width direction orthogonal to the conveyance direction is provided in front and rear of the loop-shaped antenna element 14a in the longitudinal direction, respectively.

The IC chip 15 incorporates a non-volatile memory such as EEPROM or the like in which memory is stored without power supply. The non-volatile memory of the IC chip 15 includes a tag ID storage region in which a unique number of each inlay 13 (hereinafter referred to as a tag ID) is stored in advance and a user storage region rewritable by a user. The IC chip 15 includes a communication function by an electromagnetic induction method for transmitting energy and signals by magnetic flux connection of an antenna coil of a reader/writer and the loop-shaped antenna element 14a of the antenna 14 and a radio wave method communication function for transmitting energy and signals by exchanging radio waves between the antenna of the reader/writer and the dipole antenna element 14b as well as the meander line antenna element 14c of the antenna 14.

A placing base 2 has a placing plate 21 on which the IC tag continuous body 1 is placed. The placing plate 21 is constituted capable of changing a position of a placing surface with respect to the pre-processing device 3 and the post-processing device 5 and an angle of the placing surface in accordance with a size or a paper quality of the IC tag continuous body 1. As a result, the IC tag continuous body 1 placed on the placing base 2 can be smoothly supplied to the pre-processing device 3 and the IC tag continuous body 1 issued from the post-processing device 5 can be orderly placed on the placing base 2.

The pre-processing device 3 is an encode device for writing data desired by a user such as a product number and the like in the respective IC tags 10 (the user storage region of the IC chip 15) of the IC tag continuous body 1. The pre-processing device 3 includes, by referring to FIGS. 1 and 5, a first antenna unit 31, a second antenna unit 32, a third antenna unit 33, a first tractor feeder unit 61, a first conveyance unit 62, a second conveyance unit 63, a first negative pressure suction unit 71, a second negative pressure suction unit 72, a third negative pressure suction unit 73, a fourth negative pressure suction unit 74, a first sensor 81, a second sensor 82, a third sensor 83, and a first rotary encoder unit 91.

Figure 5:
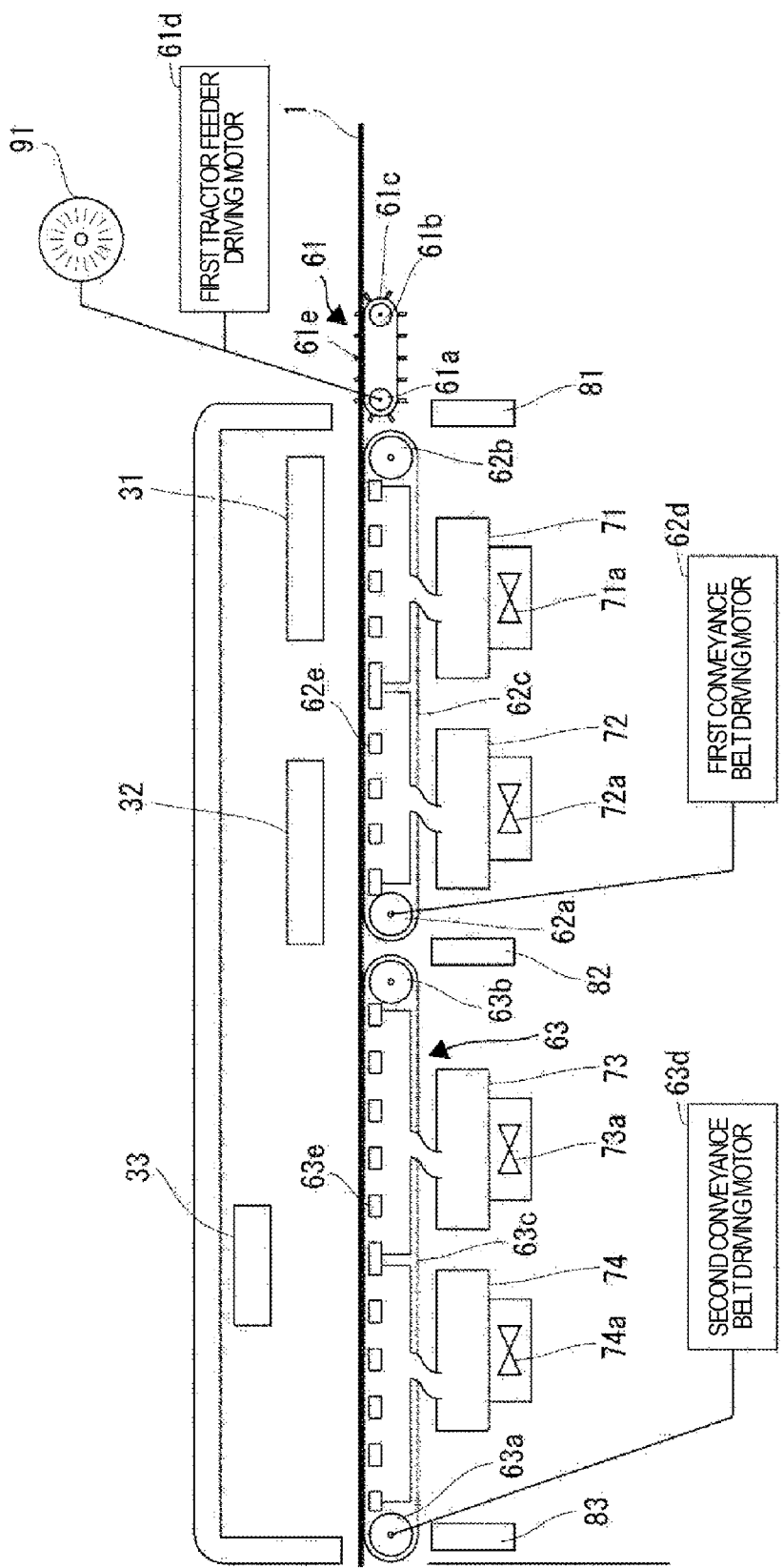
FIG. 5 is a schematic side view illustrating configuration of a pre-processing device illustrated in FIG. 1.
Figure 6:
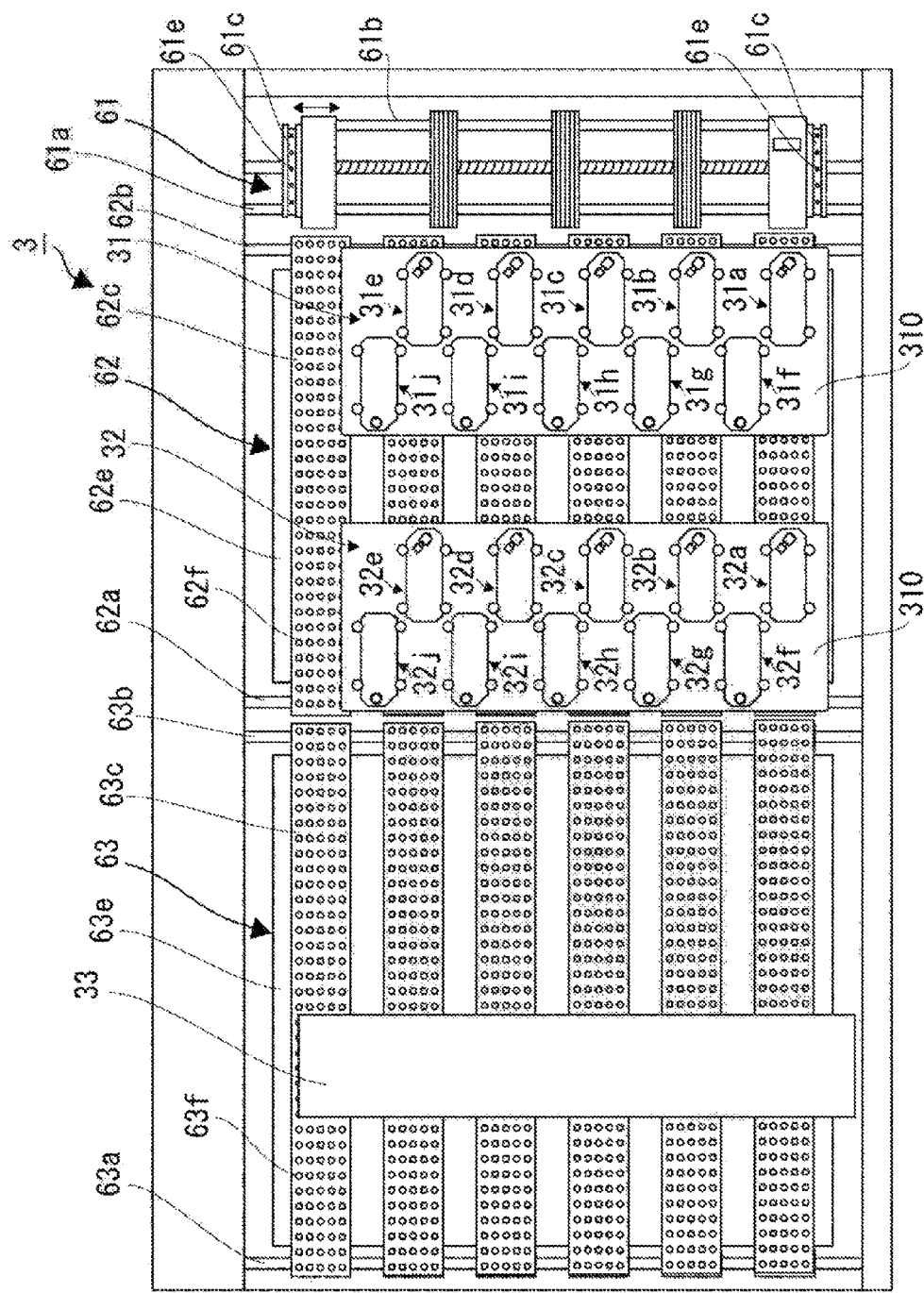
FIG. 6 is a schematic top view illustrating the configuration of the pre-processing device illustrated in FIG. 1.
Figure 7:
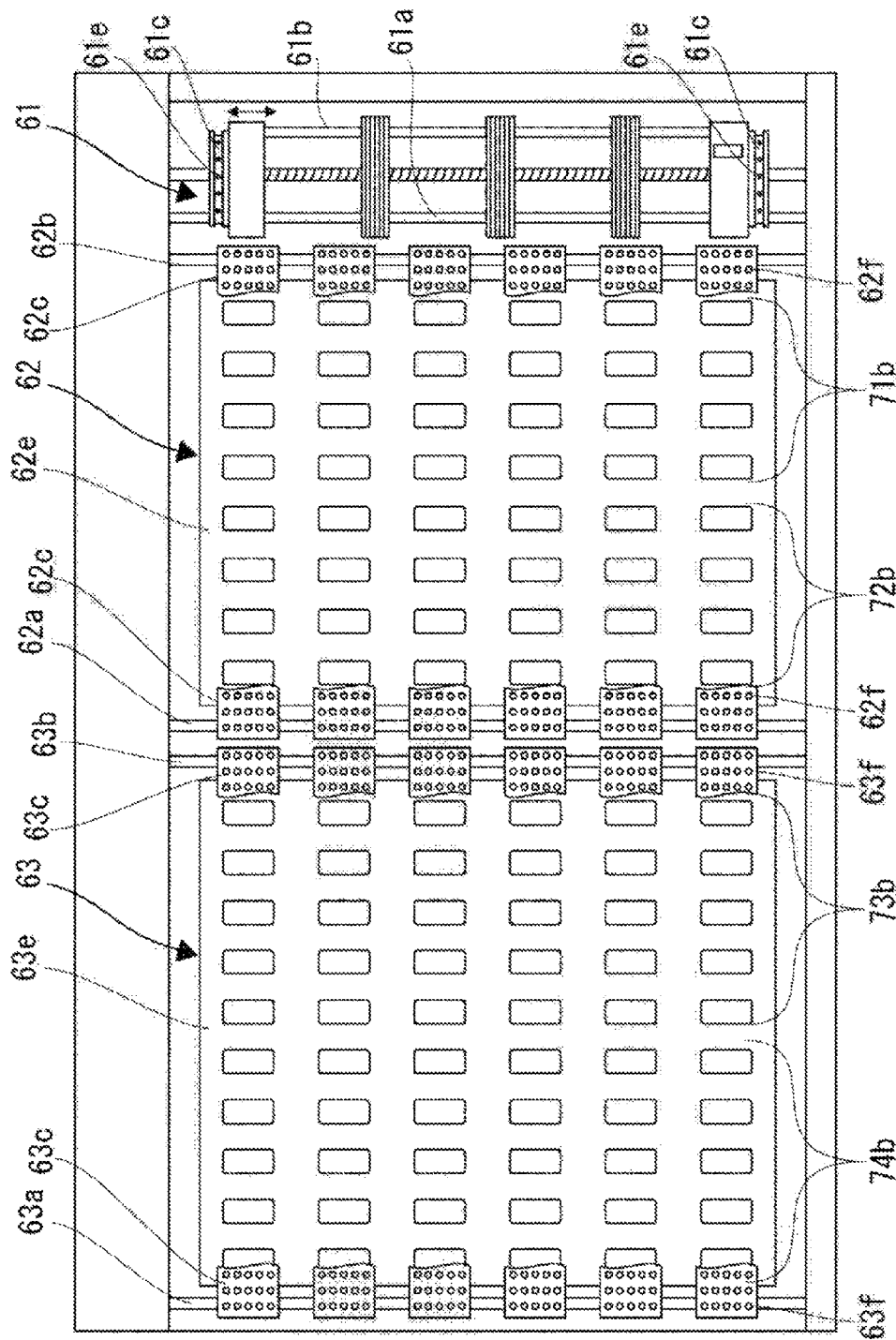
FIG. 7 is a schematic top view illustrating configuration of a support plate in the pre-processing device illustrated in FIG. 1.

The first tractor feeder unit 61 is arranged on an uppermost stream in reception of the IC tag continuous body 1 before issuance and by referring to FIGS. 5 to 7, an endless belt 61c extended between a driving roller 61a and a driven roller 61b and rotationally moved and a first tractor feeder driving motor 61*d* for rotationally moving the endless belt 61*c* through the driving roller 61*a* are provided, and on the endless belt 61*c*, feed pins 61*e* engaged with the sprocket holes 11 of the IC tag continuous body 1 are formed. As a result, as the first tractor feeder unit 61 rotationally moves the endless belt 61*c*, the feed pins 61*e* are sequentially engaged with the sprocket holes 11, capable of being disengaged, so as to tract and convey the IC tag continuous body 1 toward the first conveyance unit 62 on a downstream side. Moreover, on the driving roller 61*a* of the first tractor feeder unit 61, the first rotary encoder unit 91 for detecting rotation of the driving roller 61*a* is provided. In the vicinity of the first tractor feeder unit 61, the first sensor 81 for detecting the detection mark 12 of the IC tag continuous body 1 is provided. As a result, it is so configured that the position of the IC tag continuous body 1 (IC tag 10) in the pre-processing device 3 can be detected by the detection results of the first sensor 81 and the first rotary encoder unit 91.

The first conveyance unit 62 is arranged at the downstream side of the first tractor feeder unit 61 and includes an endless conveyance belt 62*c* extended between a driving roller 62*a* and a driven roller 62*b* and rotationally moved and a first conveyance belt driving motor 62*d* for rotationally moving the conveyance belt 62*c* through the driving roller 62*a*. The first conveyance unit 62 conveys the IC tag continuous body 1 placed on an upper surface of the conveyance belt 62*c* toward the second conveyance unit 63 at the downstream side by rotationally moving the conveyance belt 62*c*. Between the first conveyance unit 62 and the second conveyance unit 63, the second sensor 82 for detecting the detection mark 12 of the IC tag continuous body 1 is provided and is configured capable of detecting that the head of a page has reached between the first conveyance unit 62 and the second conveyance unit 63.

Moreover, at a position between the driving roller 62*a* and the driven roller 62*b* below the upper conveyance belt 62*c*, a support plate 62*e* is arranged at positions in contact with a lower surface (inner peripheral surface) of the upper conveyance belt 62*c*. Therefore, when the IC tag continuous body 1 is conveyed from the upstream side toward the downstream side, the conveyance belt 62*c* is rotationally moved while sliding on the support plate 62*e*.

At a spot of the support plate 62*e* faced with the conveyance belt 62*c*, suction holes 71*b* through which air is suctioned by rotation of a first suction fan 71*a* of the first negative pressure suction unit 71 and suction holes 72*b* through which air is suctioned by rotation of a second suction fan 72*a* of the second negative pressure suction unit 72 are formed in plural along the conveyance direction. In the conveyance belt 62*c*, a large number of through holes 62*f* are formed. Therefore, by a negative pressure by the first negative pressure suction unit 71 and the second negative pressure suction unit 72, the IC tag continuous body 1 is conveyed in a state in close contact with the conveyance belt 62*c*.

The second conveyance unit 63 is arranged at the downstream side of the first conveyance unit 62 and includes an endless conveyance belt 63*c* extended between a driving roller 63*a* and a driven roller 63*b* and rotationally moved and a second conveyance belt driving motor 63*d* for rotationally moving the conveyance belt 63*c* through the driving roller 63*a*. The second conveyance unit 63 conveys the IC tag continuous body 1 placed on the upper surface of the conveyance belt 63*c* toward the printing device 4 at the downstream side by rotationally moving the conveyance belt 63*c*. Between the second conveyance unit 63 and the printing device 4, the third sensor 83 for detecting the detection mark 12 of the IC tag continuous body 1 is provided and is configured capable of detecting that the head of a page has reached between the second conveyance unit 63 and the printing device 4.

Moreover, at a position between the driving roller 63*a* and the driven roller 63*b* below the upper conveyance belt 63*c*, a support plate 63*e* is arranged at a position in contact with a lower surface (inner peripheral surface) of the upper conveyance belt 63*c*. Therefore, when the IC tag continuous body 1 is conveyed from the upstream side toward the downstream side, the conveyance belt 63*c* is rotationally moved while sliding on the support plate 63*e*.

At a spot of the support plate 63*e* faced with the conveyance belt 63*c*, suction holes 73*b* through which air is suctioned by rotation of a third suction fan 73*a* of the third negative pressure suction unit 73 and suction holes 74*b* through which air is suctioned by rotation of a fourth suction fan 74*a* of the fourth negative pressure suction unit 74 are formed in plural along the conveyance direction. In the conveyance belt 63*c*, a large number of through holes 63*f* are formed. Therefore, by a negative pressure by the third negative pressure suction unit 73 and the fourth negative pressure suction unit 74, the IC tag continuous body 1 is conveyed in a state in close contact with the conveyance belt 63*c*.

The first antenna unit 31 and the second antenna unit 32 are arranged close to and facing above the first conveyance unit 62. The first antenna unit 31 and the second antenna unit 32 are antennas conducting communication with the IC tag 10 by the electromagnetic induction method and have the same configuration. The first antenna unit 31 is used for reading the tag ID from the IC tag 10. The second antenna unit 32 is used for writing the desired data such as a product number and the like to the IC tag 10 (the user storage region of the IC chip 15). Hereinafter, the data to be written to the IC tag 10 is called identification data. Hereinafter, configuration of the first antenna unit 31 will be described in detail by referring to FIGS. 8 to 10.

Figure 8:
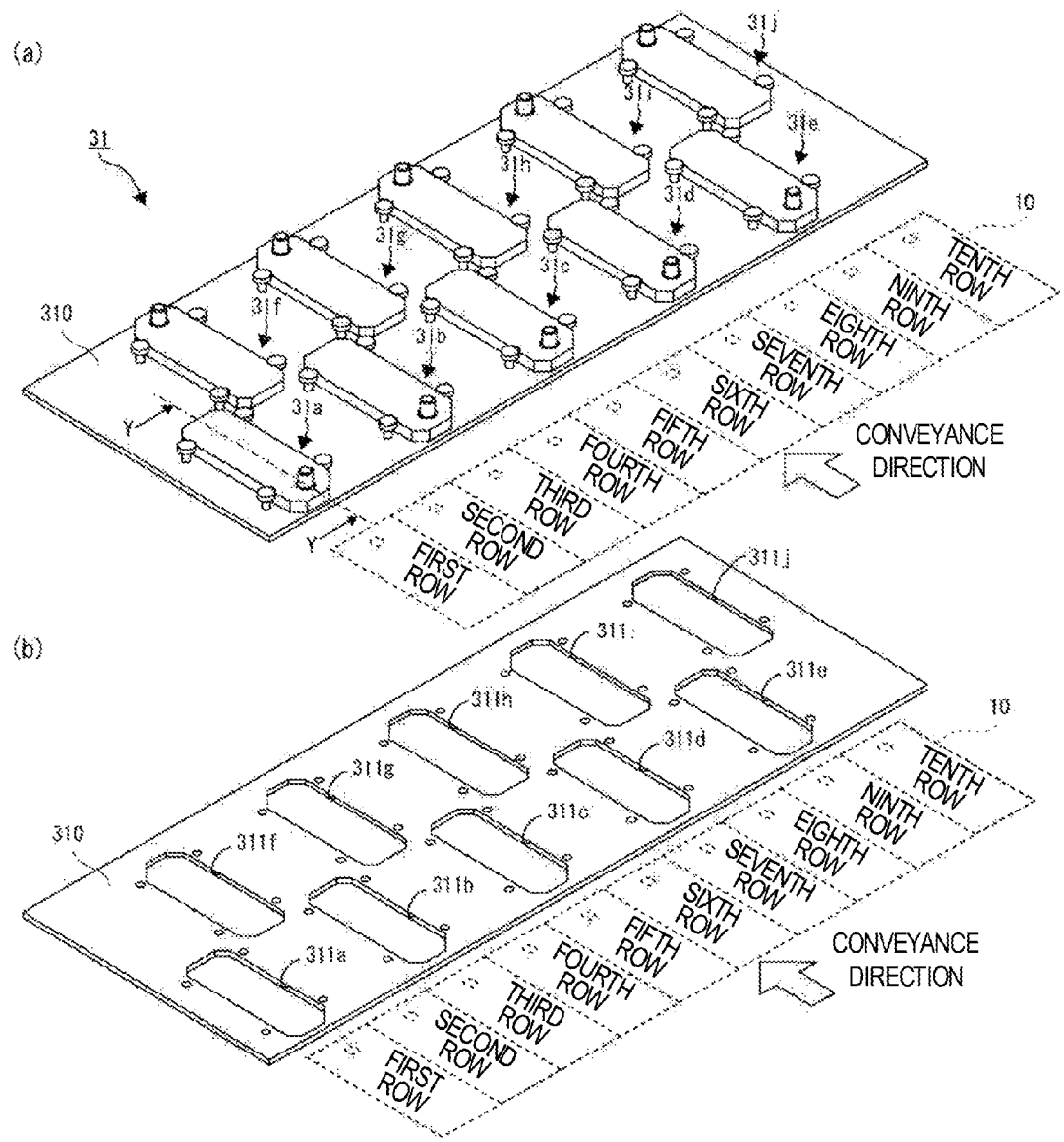
FIG. 8 is a perspective view illustrating configuration of a first antenna unit illustrated in FIG. 5.

By referring to FIG. 8(*a*), in the first antenna unit 31, row antenna units 31*a* to 31*j* are arranged at positions to face each row of the IC tags 10 from the first row to the tenth row of the IC tag continuous body 1 conveyed by the first conveyance unit 62, respectively. The row antenna units 31*a* to 31*j* are divided into the upstream-side row antenna units 31*a* to 31*e* and the downstream-side row antenna units 31*f* to 31*j* and arranged in a zigzag manner, in which the upstream-side row antenna units 31*a* to 31*e* are arranged at positions to face each row of the IC tags 10 on the odd-number rows, respectively, while the downstream-side row antenna units 31*f* to 31*j* are arranged at positions to face each row of the IC tags 10 on the even-number rows, respectively.

A shield plate 310 is a support plate supporting the row antenna units 31*a* to 31*j* and is constituted by metal such as aluminum or a conductive substance such as a conductive resin. The shield plate 310 is arranged in parallel with and close to the IC tag continuous body 1 conveyed by the first conveyance unit 62, and opening portions 311*a* to 311*j* corresponding to the row antenna units 31*a* to 31*j*, respectively, are formed by being divided into the upstream opening portions 311*a* to 311*e* and the downstream opening portions 311*f* to 311*j* in a zigzag manner. Each of the opening portions 311*a* to 311*j* has an elongated and substantially rectangular shape with the conveyance direction as its longitudinal direction, in which, regarding the upstream-side opening portions 311*a* to 311*e*, the shape of only one corner on the upstream side is different, while regarding the downstream opening portions 311f to 311j, the shape of only one corner on the downstream side is different. In the shield plate 310, regions formed between the upstream-side opening portions 311a to 311e and between the downstream opening portions 311f to 311j, respectively, are interfering preventing regions preventing interference among communication.

Figure 9:
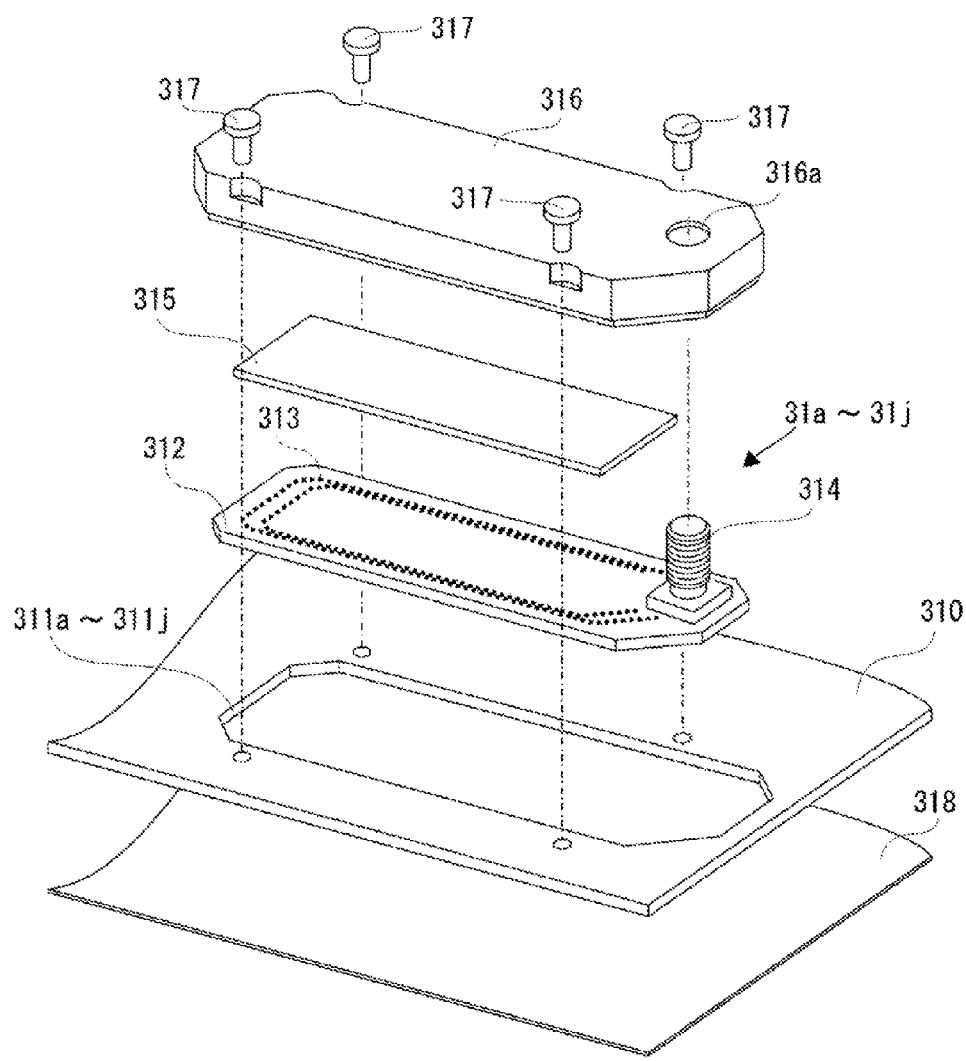
FIG. 9 is an exploded perspective view illustrating configuration of a row antenna unit illustrated in FIG. 8.
Figure 10:
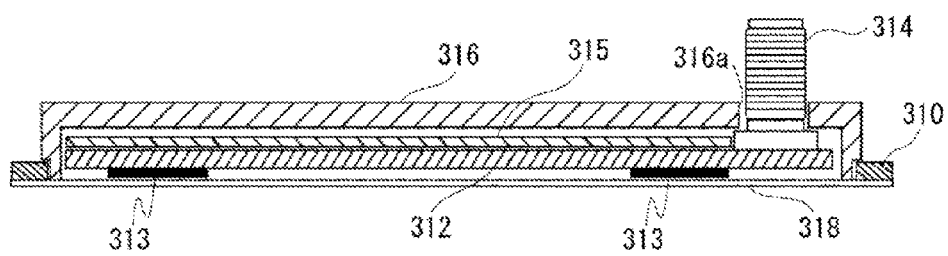
FIG. 10 is a sectional view illustrating the configuration of the row antenna unit illustrated in FIG. 8.

The row antenna units 31a to 31j are constituted by a printed board 312 having a substantially same shape as those of the opening portions 311a to 311j, a loop-shaped antenna element 313 formed on a lower surface of the printed board 312, an antenna terminal 314 installed upright on an upper surface opposite to the loop-shaped antenna element 313 on an end portion of the printed board 312, a ferrite sheet 315, and an antenna case 316 covering the printed board 312 from an upper surface side by referring to FIGS. 9 and 10. In the printed board 312, the shape of only one corner on the end portion side on which the antenna terminal 314 is installed upright is different. The antenna case 316 is constituted by metal such as aluminum or a conductive substance such as a conductive resin, an opening 316a for terminal through which the antenna terminal 314 is penetrated is formed, and by penetrating the antenna terminal 314 into the opening 316a for terminal in a state in which the ferrite sheet 315 is interposed between the antenna case 316 and the printed board 312 and by attaching a retaining ring, not shown, to the antenna terminal 314, the printed board 312 is fixed to the antenna case 316. The ferrite sheet 315 covers the loop-shaped antenna element 313 from the upper surface side of the printed board 312 and can suppress radiation from the printed board 312. Then, the antenna case 316 is fixed to the upper surface side of the shield plate 310 by a screw 317 so that the printed boards 312 are fitted into the opening portions 311a to 311j. In this state, those other than the surface faced with the IC tag continuous body 1 are electromagnetically shielded, and the surface of the printed board 312 on which the loop-shaped antenna element 313 is formed is directly faced with the IC tag continuous body 1 conveyed by the first conveyance unit 62.

In the opening portions 311a to 311j and the printed board 312, only one corner has a different elongated and substantially rectangular shape and thus, they are fitted in one unique direction. In the opening portions 311a to 311e at the upstream side, the shape of only one corner at the upstream side is different and thus, in each of the row antenna units 31a to 31e at the upstream side, the antenna terminal 314 installed in contact on the end portion of the printed board 312 is located at the upstream side. Moreover, in the opening portions 311f to 311j at the downstream side, the shape of only one corner at the downstream side is different and thus, in each of the row antenna units 31f to 31j at the downstream side, the antenna terminal 314 installed in contact on the end portion of the printed board 312 is located at the downstream side. As described above, each of the antenna terminals 314 of the row antenna units 31a to 31e arranged at the upstream side and each of the antenna terminals 314 of the row antenna units 31f to 31j arranged at the downstream side are respectively arranged in directions separated away from each other. As a result, interference between the each of the antenna terminals 314 of the row antenna units 31a to 31e arranged at the upstream side and each of the antenna terminals 314 of the row antenna units 31f to 31j arranged at the downstream side can be prevented.

Reference numeral 318 denoted in FIGS. 9 and 10 is a non-adhesive coating sheet such as a silicone coating sheet bonded to the lower surface of the shield plate 310 so as to cover the opening portions 311a to 311j. If the IC tag continuous body 1 is a label continuous body temporarily attached to a mount, by providing the non-adhesive coating sheet 318, adhesion of the label to the shield plate 310 can be prevented. The non-adhesive coating sheet 318 can be bonded so as to cover the whole shield plate 310 including the opening portions 311a to 311j on the lower surface.

The third antenna unit 33 is arranged facing above the second conveyance unit 63. The third antenna unit 33 is an antenna conducting communication with the IC tag 10 by a radio wave method different from those of the first antenna unit 31 and the second antenna unit 32. The third antenna unit 33 is used for writing identification data to the IC tag 10.

The printing device 4 is printing means for applying printing of data of a product or a producer or a barcode obtained by coding it or the like on the surfaces of the respective IC tags 10 of the IC tag continuous body 1. Hereinafter, the data of a product or a producer or data such as a barcode obtained by coding it or the like to be printed on the surface of the IC tag 10 will be referred to as print data. The printing device 4 includes, by referring to FIG. 11, a print unit 41, an optical fixation unit 42, and a filter unit 43 and by referring to FIG. 1, a second tractor feeder unit 64, a third conveyance unit 65, a discharge roller 66, and a fifth negative pressure suction unit 75.

Figure 11:
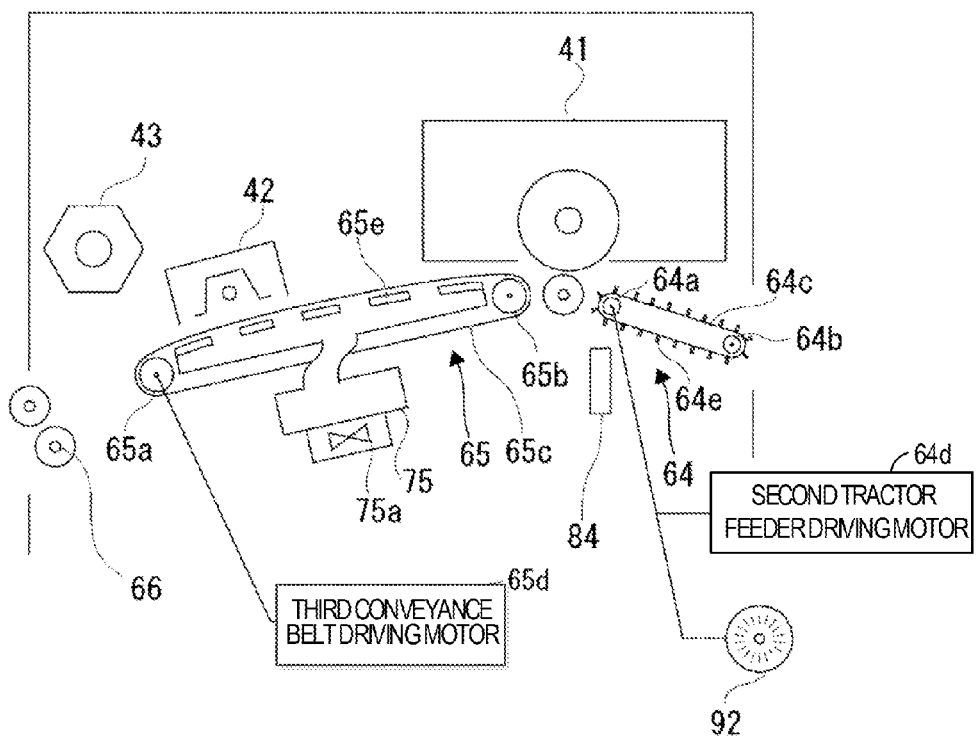
FIG. 11 is a schematic side view illustrating configuration of a printing device illustrated in FIG. 1.

The second tractor feed unit 64 is arranged at the uppermost stream receiving the IC tag continuous body 1 from the pre-processing device 3 and by referring to FIG. 11, includes an endless belt 64c extended between a driving roller 64a and a driven roller 64b and rotationally moved and a second tractor feeder driving motor 64d for rotationally moving the endless belt 64c through the driving roller 64a, and on the endless belt 64c, feed pins 64e engaged with the sprocket holes 11 of the IC tag continuous body 1 are formed. As a result, as the second tractor feeder unit 64 rotationally moves the endless belt 64c, the feed pins 64e are sequentially engaged with the sprocket holes 11, capable of being disengaged, so as to tract and convey the IC tag continuous body 1 toward the print unit 41 at a downstream side. Moreover, on the driving roller 64a of the second tractor feeder unit 64, a second rotary encoder unit 92 for detecting rotation of the driving roller 64a is provided. Between the second tractor feeder unit 64 and the print unit 41, a fourth sensor 84 for detecting the detection mark 12 of the IC tag continuous body 1 is provided. As a result, it is so configured that the position of the IC tag continuous body 1 (IC tag 10) in the printing device 4 can be detected by the detection results of the fourth sensor 84 and the second rotary encoder unit 92.

The print unit 41 employs an electrophotography method such as a laser in which a latent image is formed by laser beams on a photosensitive drum, and this latent image is developed by a toner and then transferred to the surface of the IC tag 10. The print unit 41 applies printing of data of a product or a producer or a barcode obtained by coding it or the like on the surfaces of the respective IC tags 10 on the IC tag continuous body 1 and also prints a page number in a region in the vicinity of a page head other than the IC tag 10 or a region in which the sprocket holes 11 are formed, for example. A print method of the print unit 41 is not limited to the electrophotography method but a heat transfer method, a thermal method or an inkjet method can be also used.

The third conveyance unit 65 is arranged at the downstream side of the print unit 41 and includes an endless conveyance belt 65c extended between a driving roller 65a and a driven roller 65b and rotationally moved and a third conveyance belt driving motor 65d for rotationally moving the conveyance belt 65c through the driving roller 65a. The third conveyance unit 65 conveys the IC tag continuous body 1 placed on the upper surface of the conveyance belt 65c toward the post-processing device 5 through the discharge roller 66 at the downstream side by rotationally moving the conveyance belt 65c.

At a position between the driving roller 65a and the driven roller 65b below the conveyance belt 65c at the upper side, a support plate 65e is arranged at a position in contact with the lower surface (inner peripheral surface) of the upper conveyance belt 65c. Therefore, when the IC tag continuous body 1 is conveyed from the upstream side toward the downstream side, the conveyance belt 65c is rotationally moved while sliding on the support plate 65e.

In a spot of the support plate 65e facing the conveyance belt 65c, a plurality of suction holes through which air is suctioned by rotation of the fifth suction fan 75a of the fifth negative pressure suction unit 75 are formed along the conveyance direction. In the conveyance belt 65c, a large number of though holes are formed. Therefore, the IC tag continuous body 1 is conveyed by the negative pressure by the fifth negative pressure suction unit 75 in a state in close contact with the conveyance belt 65c.

The optical fixation unit 42 fixes a toner image by melting toner having been transferred by the print unit 41 by irradiating flash light using a xenon tube or the like to the surface of the IC tag continuous body 1 conveyed by the third conveyance unit 65. As a result, the toner image can be fixed in a non-contact manner without causing damage (external force) to the IC tag 10.

The filter unit 43 is an air filter for erasing gas or odor generated in optical fixation by the optical fixation unit 42.

The post-processing device 5 verifies that the identification data has been correctly written in the respective IC tags 10 of the IC tag continuous body 1 and also marks the IC tag 10 in which the identification data has not been correctly written. The post-processing device 5 includes, by referring to FIG. 12, a fourth antenna unit 51, an emboss processing unit 52, a fourth conveyance unit 67, a sixth negative pressure suction unit 76, a seventh negative pressure suction unit 77, a page-number reading unit 93, a fifth sensor 85, a sixth sensor 86, and a seventh sensor 87.

The fourth conveyance unit 67 includes an endless conveyance belt 67c arranged at the uppermost stream of the post-processing device 5 receiving the IC tag continuous body 1 from the printing device 4 and extended between a driving roller 67a and a driven roller 67b and rotationally moved, and a fourth conveyance belt driving motor 67d for rotationally moving the conveyance belt 67c through the driving roller 67a. The fourth conveyance unit 67 conveys the IC tag continuous body 1 placed on the upper surface of the conveyance belt 67c toward the emboss processing unit 52 at the downstream side by rotationally moving the conveyance belt 67c. Between the fourth conveyance unit 67 and the emboss processing unit 52, the sixth sensor 86 for detecting the detection mark 12 of the IC tag continuous body 1 is provided and is configured capable of detecting that the head of a page has reached between the fourth conveyance unit 67 and the emboss processing unit 52. Moreover, at a discharge port of the emboss processing unit 52, the seventh sensor 87 for detecting the detection mark 12 of the IC tag continuous body 1 is provided and is configured capable of detecting jamming or the like at the emboss processing unit 52.

Moreover, at a position between the driving roller 67a and the driven roller 67b below the upper conveyance belt 67c, a support plate 67e is arranged at a position in contact with a lower surface (inner peripheral surface) of the upper conveyance belt 67c. Therefore, when the IC tag continuous body 1 is to be conveyed from the upstream side toward the downstream side, the conveyance belt 67c is rotationally moved while sliding on the support plate 67e.

In a spot of the support plate 67e facing the conveyance belt 67c, suction holes through which air is suctioned by rotation of the sixth suction fan 76a of the sixth negative pressure suction unit 76 and suction holes through which the air is suctioned by rotation of the seventh suction fan 77a of the seventh negative pressure suction unit 77 are formed in plural along the conveyance direction. In the conveyance belt 67c, a large number of though holes are formed. Therefore, the IC tag continuous body 1 is conveyed by the negative pressures by the sixth negative pressure suction unit 76 and the seventh negative pressure suction unit 77 in a state in close contact with the conveyance belt 67c.

The fifth sensor 85 is arranged at the vicinity of the uppermost stream in the post-processing device 5 receiving the IC tag continuous body 1 from the printing device 4 and is configured capable of detecting that the head of the page has reached the post-processing device 5. Moreover, the page-number reading unit 93 is also arranged at the vicinity of the uppermost stream receiving the IC tag continuous body 1 from the printing device 4, and when the fact that the head of the page has reached the post-processing device 5 is detected by the fifth sensor 85, by photographing the surface of the IC tag continuous body 1, the page number printed by the printing device 4 is read.

The fourth antenna unit 51 is arranged facing above the fourth conveyance unit 67. The fourth antenna unit 51 is an antenna conducting communication with the IC tag 10 by a radio wave method different from those of the first antenna unit 31 and the second antenna unit 32. The fourth antenna unit 51 is used for reading the tag ID and the identification data written in the IC tag 10 from the IC tag 10 conveyed by the fourth conveyance unit 67.

Figure 12:
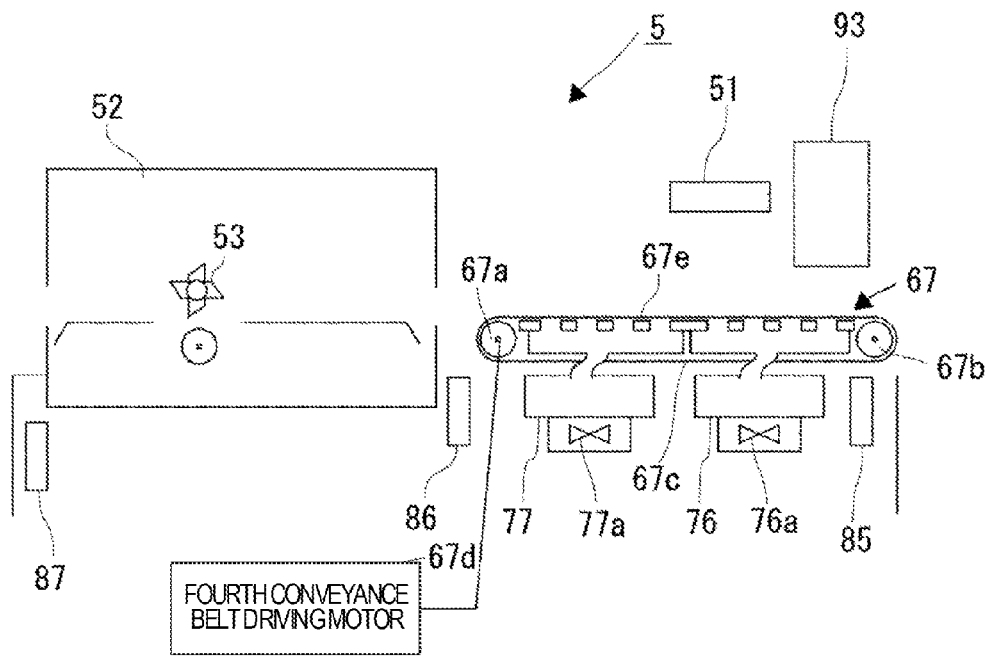
FIG. 12 is a schematic side view illustrating configuration of a post-processing device illustrated in FIG. 1.

The emboss processing unit 52 includes, by referring to FIG. 12, cutter members 53 corresponding to each row of the IC tags 10 arranged in multiple rows, respectively, are formed. The cutter member 53 is mark giving means for executing emboss processing of cutting and bending a part of an end portion of the IC tag 10. Then, the emboss processing unit 52 executes the emboss processing by cutting/raising and bending the part of the end portion by using the cutter member 53 to the IC tag 10 in which the identification data could not be correctly written.

The first antenna unit 31 as well as the second antenna unit 32, the third antenna unit 33, and the fourth antenna unit 51 are arranged facing the conveyance belt 62c of the first conveyance unit 62 as well as the support plate 62e, the conveyance belt 63c of the second conveyance unit 63 as well as the support plate 63e, and the conveyance belt 67c of the fourth conveyance unit 67 as well as the support plate 67e, respectively. Therefore, the conveyance belts 62c, 63c, and 67c as well as the support plates 62e, 63e, and 67e preferably have low dielectric constants so that a resonant frequency of the antenna of the IC tag continuous body 1 (IC tags 10) does not change in order to keep transaction between the IC tag continuous body 1 (IC tags 10) facing each of the antenna units favorable. Moreover, the conveyance belts 62c, 63c, and 67c slide in a state subjected to a negative pressure in directions of the support plates 62e, 63e, and 67e, respectively, and thus, it is important that friction caused by sliding between the conveyance belts 62c, 63c, and 67c and the support plates 62e, 63e, and 67e is small, and the conveyance belts 62c, 63c, and 67c and the support plates 62e, 63e, and 67e have excellent friction resistance (material with low friction coefficients) and hard to be electrically charged. Thus, in this embodiment, urethane belts are used for the conveyance belts 62c, 63c, and 67c, and POM (polyacetal resin) plates are used for the support plates 62e, 63e, and 67e.

Figure 13:
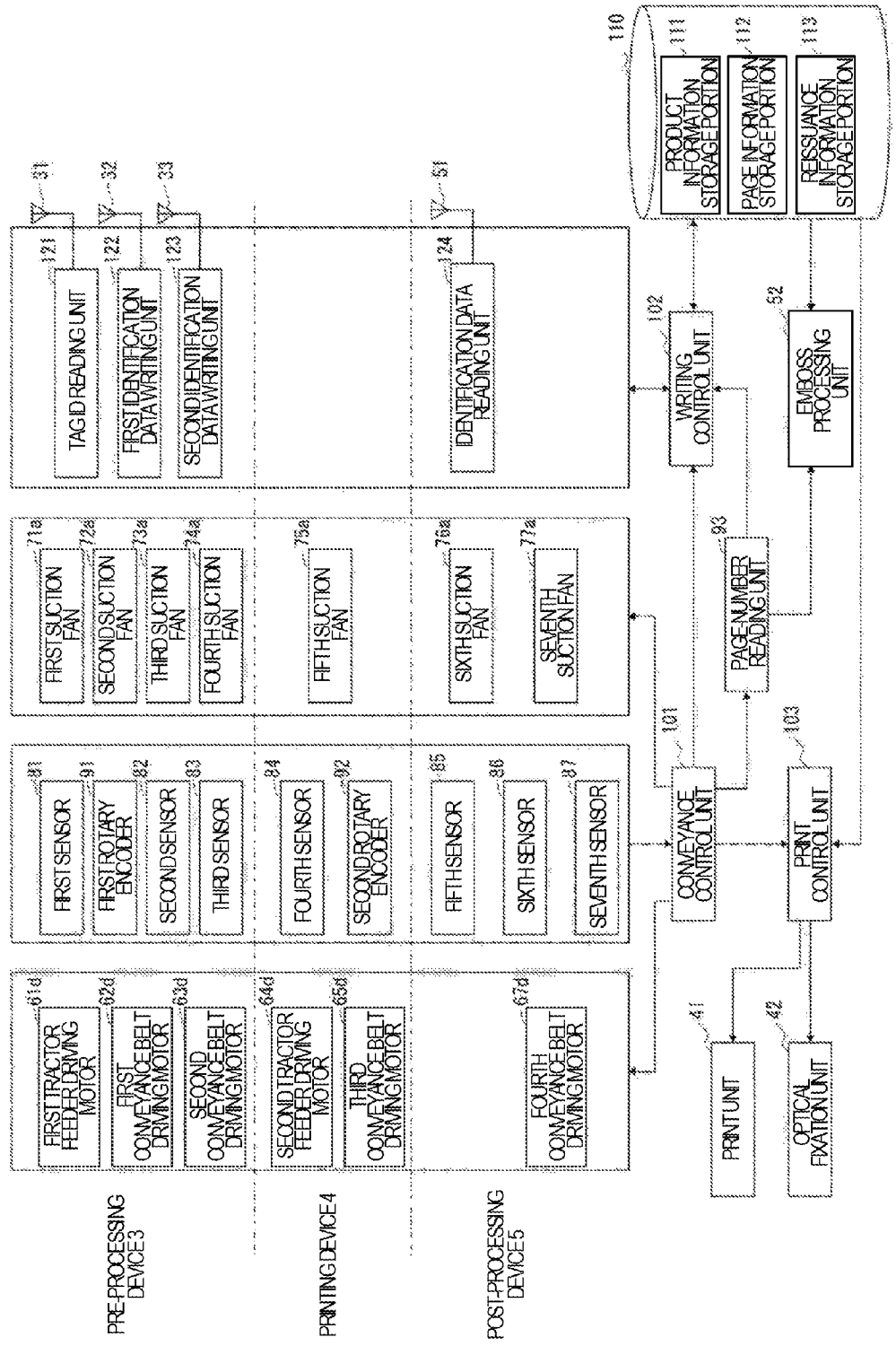
FIG. 13 is a block diagram illustrating configuration of a control unit controlling an operation of an embodiment of an IC tag issuing apparatus according to the present invention.

Subsequently, configuration of the control unit for controlling an operation of the IC tag issuing apparatus of this embodiment will be described in detail by referring to FIGS. 13 to 15. The IC tag issuing apparatus of this embodiment includes, by referring to FIG. 13, a conveyance control unit 101, a writing control unit 102, a print control unit 103, an information storage unit 110, a tag ID reading unit 121, a first identification data writing unit 122, a second identification data writing unit 123, and an identification data reading unit 124.

The conveyance control unit 101 is an information processing unit such as a microcomputer including a CPU (Central Processing Unit), a ROM (Read Only Memory), RAM (Random Access Memory) and the like. The ROM of the conveyance control unit 101 stores a control program for performing conveyance control of the IC tag continuous body 1. The conveyance control unit 101 causes the IC tag continuous body 1 to be conveyed by controlling a conveyance constituent element group (the first tractor feeder driving motor 61d, the first conveyance belt driving motor 62d, the second conveyance belt driving motor 63d, the second tractor feeder driving motor 64d, the third conveyance belt driving motor 65d, the fourth conveyance belt driving motor 67d) and a suction constituent element group (the first suction fan 71a, the second suction fan 72a, the third suction fan 73a, the fourth suction fan 74a, the firth suction fan 75a, the sixth suction fan 76a, the seventh suction fan 77a) in accordance with inputs from a position sensor group (the first sensor 81, the first rotary encoder unit 91, the second sensor 82, the third sensor 83, the fourth sensor 84, the second rotary encoder unit 92, the fifth sensor 85, the sixth sensor 86, the seventh sensor 87) by reading the control program stored in the ROM and extending the control program to the RAM.

The writing control unit 102 is an information processing unit such as a microcomputer or the like including a CPU (Central Processing Unit), a ROM (Read Only Memory), RAM (Random Access Memory) and the like. The ROM of the writing control unit 102 stores a control program for writing the identification data in the respective IC tags 10 of the IC tag continuous body 1. The writing control unit 102 writes the identification data in the respective IC tags 10 of the IC tag continuous body 1 by reading the control program stored in the ROM and by extending the control program to the RAM so as to control a communication constituent element group (the tag ID reading unit 121, the first identification data writing unit 122, the second identification data writing unit 123, the identification data reading unit 124).

The print control unit 103 is an information processing unit such as a microcomputer including a CPU (Central Processing Unit), a ROM (Read Only Memory), RAM (Random Access Memory) and the like. The ROM of the print control unit 103 stores a control program for operating the print unit 41 and the optical fixation unit 42. The print control unit 103 causes the print data to be printed on the surfaces of the respective IC tags 10 of the IC tag continuous body 1 by reading the control program stored in the ROM and by extending the control program to the RAM so as to control the print unit 41 and the optical fixation unit 42.

The information storage unit 110 is storage means such as a semiconductor memory, a HDD (Hard Disk Drive) and the like and includes a product information storage portion 111, a page information storage portion 112, and a reissuance information storage portion 113.

The product information storage portion 111 is storage means for storing product information input through a network, not shown, or various recording media. The product information is list information composed of identification data (management number and the like) to be written to the respective IC tags 10 of the IC tag continuous body 1, print data (product number, product name and the like) to be printed on the surfaces of the respective IC tags 10 of the IC tag continuous body 1, and the tag ID of the IC tag 10 in which the identification data is written as illustrated in FIG. 14. The tag ID is empty as illustrated in FIG. 14A until the identification data is written to the IC tag 10, and the tag ID of the IC tag 10 in which the identification data has been written is described as illustrated in FIG. 14B after the identification data is written to the IC tag 10.

The page information storage portion 112 is storage means for storing page information generated for each page of the IC tag continuous body 1. The page information is composed of, by referring to FIG. 15A, matrix information indicating a position of the tag ID on the page, the read-out tag ID, the identification data (management number and the like) to be written in the respective IC tags 10 of one page, the print data (product number, product name and the like) to be printed on the surfaces of the respective IC tags 10 of one page, and the tag ID of the IC tag 10 in which the identification data is written. As the page information storage portion 112, a storage region may be ensured on the RAM of the writing control unit 102 or the print control unit 103 so as to be used as a buffer.

The reissuance information storage portion 113 is storage means for storing reissuance information for reissuance altogether at the end. The reissuance information is composed of, by referring to FIG. 15B, the identification data which failed to be written to the IC tag 10 and the corresponding print data (product number, product name and the like). A flag indicating whether or not writing to the IC tag 10 has succeeded may be provided in the product information stored in the product information storage portion 111 so that the product information is used as the reissuance information.

The tag ID reading unit 121 is a reader/writer for reading the tag ID from the IC tag 10 of the IC tag continuous body 1 being conveyed by the first conveyance unit 62 by an electromagnetic induction method by using the first antenna unit 31. The tag ID reading unit 121 has a function of conducting communication with the IC tag 10 through a plurality of channels with different frequencies and is configured to use different channels for the row antenna units 31a to 31j adjacent at least in the width direction and a diagonal direction.

The first identification data writing unit 122 is a reader/writer for writing the identification data by the electromagnetic induction method to the IC tag 10 of the IC tag continuous body 1 being conveyed by the first conveyance unit 62 by using the second antenna unit 32. The first identification data writing unit 122 has a function of conducting communication with the IC tag 10 through a plurality of channels with different frequencies and is configured to use different channels for the row antenna units 32a to 32j adjacent at least in the width direction and the diagonal direction.

The second identification data writing unit 123 is a reader/writer for writing the identification data by the radio wave method to the IC tag 10 of the IC tag continuous body 1 being conveyed by the second conveyance unit 63 by using the third antenna unit 33.

The identification data reading unit 124 is a reader/writer for reading the tag ID and the identification data by the radio wave method from the IC tag 10 of the IC tag continuous body 1 being conveyed by the fourth conveyance unit 67 by using the fourth antenna unit 51.

Subsequently, a issuing operation of the IC tag issuing apparatus of this embodiment will be described in detail by referring to FIGS. 16 to 18. When the IC tag continuous body 1 is set on the first tractor feeder unit 61 and a start button, not shown, is pressed down, the conveyance control unit 101 causes the IC tag continuous body 1 to be conveyed by controlling the conveyance constituent element group (the first tractor feeder driving motor 61*d*, the first conveyance belt driving motor 62*d*, the second conveyance belt driving motor 63*d*, the second tractor feeder driving motor 64*d*, the third conveyance belt driving motor 65*d*, the fourth conveyance belt driving motor 67*d*). In the IC tag issuing apparatus of this embodiment, conveyance of the IC tag continuous body 1 is performed on the basis of a print speed of the printing device 4, and a series of processing is executed in the pre-processing device 3 and the post-processing device 5 in a state in which the IC tag continuous body 1 is being conveyed at all times.

Figure 16:
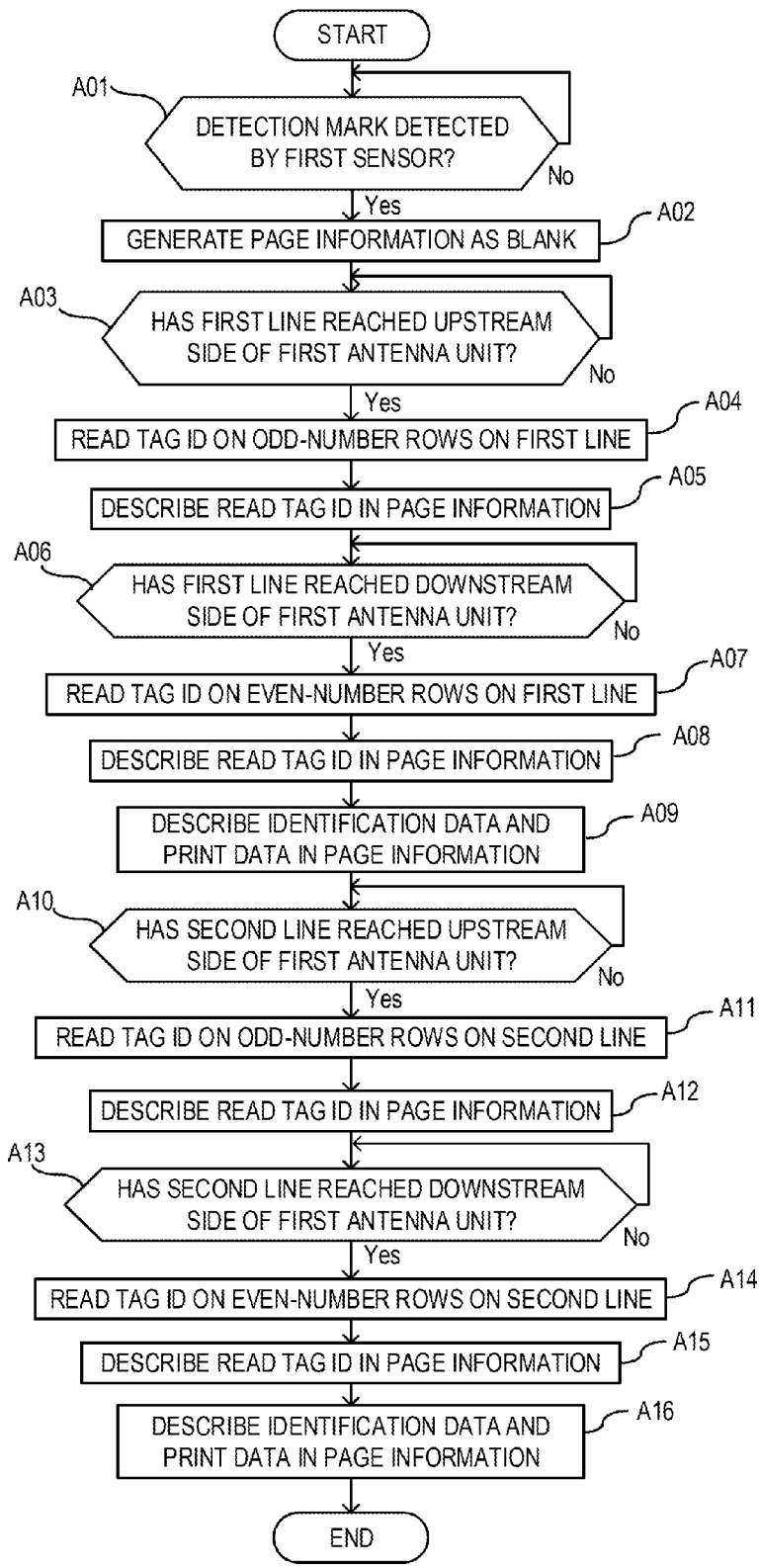
FIG. 16 is a flowchart for explaining a tag ID reading operation in an embodiment of the IC tag issuing apparatus according to the present invention.

By referring to FIG. 16, the conveyance control unit 101 waits for detection of the detection mark 12 by the first sensor 81 provided in the vicinity of the first tractor feeder unit 61 (Step A01). Then, when the detection mark 12 notifying start of a page is detected by the first sensor 81, the detection of the detection mark 12 is notified to the writing control unit 102.

Then, the writing control unit 102 notified of the detection of the detection mark 12 generates blank page information (Step A02). Subsequently, the conveyance control unit 101 grasps a conveyance distance of the IC tag continuous body 1 by a detection result of the first rotary encoder unit 91 and waits for arrival of the IC tags 10 on the first line at the row antenna units 31*a* to 31*e* located at the upstream side in the first antenna unit 31 (Step A03). Specifically, when all the loop-shaped antenna elements 14*a* of the IC tags 10 on the odd-number rows on the first line enter the loop-shaped antenna elements 313 of the row antenna units 31*a* to 31*e*, it is determined to be arrival.

When the IC tags 10 on the first line reach the row antenna units 31*a* to 31*e* located at the upstream side in the first antenna unit 31, the fact is notified by the conveyance control unit 101 to the writing control unit 102. The writing control unit 102 causes the tag IDs from the IC tags 10 on the odd-number rows on the first line to be read by the tag ID reading unit 121, respectively (Step A04) and describes the read tag IDs in the page information generated at Step A02 (Step A05). A data record of the IC tag 10 from which the tag ID could not be read is maintained in a blank state. FIG. 17A illustrates a state in which the tag IDs are successfully read from all the IC tags 10 on the odd-number rows on the first line, respectively, and the read tag IDs are described in the page information.

Subsequently, the conveyance control unit 101 grasps the conveyance distance of the IC tag continuous body 1 by the detection result of the first rotary encoder unit 91 and waits for the arrival of the IC tags 10 on the first line at the row antenna units 31*f* to 31*j* located at the downstream side in the first antenna unit 31 (Step A06). Specifically, when all the loop-shaped antenna elements 14*a* of the IC tags 10 on the even-number rows on the first line enter the loop-shaped antenna elements 313 of the row antenna units 31*f* to 31*j*, it is determined to be arrival.

When the IC tags 10 on the first line reach the row antenna units 31*f* to 31*j* located at the downstream side in the first antenna unit 31, the fact is notified by the conveyance control unit 101 to the writing control unit 102. The writing control unit 102 causes the tag IDs to be read by the tag ID reading unit 121 from the IC tags 10 on the even-number rows on the first line, respectively (Step A07) and describes the read tag IDs in the page information generated at Step A02 (Step A08).

At this point of time, the normal IC tags 10 on the first line are determined on the basis of the fact whether the tag ID is described or not. The writing control unit 102 sequentially reads the identification data and the print data to be stored in the normal IC tags 10 on the first line from the product information and describes the read identification data and print data in the data record of the page information in which the tag IDs are described (Step A09). FIG. 17B illustrates a state in which the tag IDs are successfully read also from all the IC tags 10 on the even-number rows on the first line, respectively, the tag IDs are described in all the data records on the first line in the page information, respectively, and moreover, the identification data and the print data read out of the product information are described. The identification data and the print data read out of the product information and described in the page information are controlled by a flag or the like so that they are not read out from the product information and described in the page information again.

Subsequently, the conveyance control unit 101 grasps the conveyance distance of the IC tag continuous body 1 by the detection result of the first rotary encoder unit 91 and waits for the arrival of the IC tags 10 on the second line at the row antenna units 31*a* to 31*e* located at the upstream side in the first antenna unit 31 (Step A10). Specifically, when all the loop-shaped antenna elements 14*a* of the IC tags 10 on the odd-number rows on the second line enter the loop-shaped antenna elements 313 of the row antenna units 31*a* to 31*e*, it is determined to be arrival.

When the IC tags 10 on the second line reach the row antenna units 31*a* to 31*e* located at the upstream side in the first antenna unit 31, the fact is notified by the conveyance control unit 101 to the writing control unit 102. The writing control unit 102 causes the tag IDs to be read by the tag ID reading unit 121 from the IC tags 10 on the odd-number rows on the second line, respectively (Step A11) and describes the read tag IDs in the page information generated at Step A02 (Step A12).

Subsequently, the conveyance control unit 101 grasps the conveyance distance of the IC tag continuous body 1 by the detection result of the first rotary encoder unit 91 and waits for the arrival of the IC tags 10 on the second line at the row antenna units 31*f* to 31*j* located at the downstream side in the first antenna unit 31 (Step A13). Specifically, when all the loop-shaped antenna elements 14*a* of the IC tags 10 on the even-number rows on the second line enter the loop-shaped antenna elements 313 of the row antenna units 31*f* to 31*j*, it is determined to be arrival.

When the IC tags 10 on the second line reach the row antenna units 31*f* to 31*j* located at the downstream side in the first antenna unit 31, the fact is notified by the conveyance control unit 101 to the writing control unit 102. The writing control unit 102 causes the tag IDs to be read by the tag ID reading unit 121 from the IC tags 10 on the even-number rows on the second line, respectively (Step A14) and describes the read tag IDs in the page information generated at Step A02 (Step A15). At this point of time, the normal IC tags 10 on the second line are determined on the basis of the fact whether the tag ID is described or not. The writing control unit 102 sequentially reads the identification data and the print data to be stored in the normal IC tags 10 on the second line from the product information and describes the read identification data and print data in the data record of the page information in which the tag IDs are described (Step A16). FIG. 15A illustrates a state in which the tag IDs could not be read out of the IC tags 10 on the first row on the second line and the data record on the first row on the second line is blank.

The reading of the tag IDs at Steps A04, A07, A11, and A14 may be performed several times until the IC tag 10 goes out of the communication region of the row antenna units 31a to 31j (until the loop-shaped antenna elements 14a of the IC tags 10 go out of the loop-shaped antenna elements 313 of the row antenna units 31a to 31j).

The tag-ID reading operation at Steps A1 to A16 is performed in order to determine whether or not the IC tag 10 functions normally. Therefore, whether or not the IC tag 10 is normal is determined on the basis of whether or not the tag ID is described in the page information.

Moreover, liming when the IC tags 10 on the first line reach the row antenna units 31f to 31j located at the downstream side in the first antenna unit 31 at Step A06 and timing when the IC tags 10 on the second line reach the row antenna units 31a to 31e located on the upstream side in the first antenna unit 31 at Step A10 can be switched or substantially the same depending on a pitch of the IC tags 10 or a size or layout of the row antenna units 31a to 31j. In this case, the communication is conducted at the same time in the row antenna units 31a to 31e located at the upstream side and the row antenna units 31f to 31j located at the downstream side, but since the row antenna units 31a to 31j adjacent in the diagonal direction conduct communication by using different channels, interference can be prevented and communication can be reliably conducted with the targeted IC tags 10.

Figure 18:
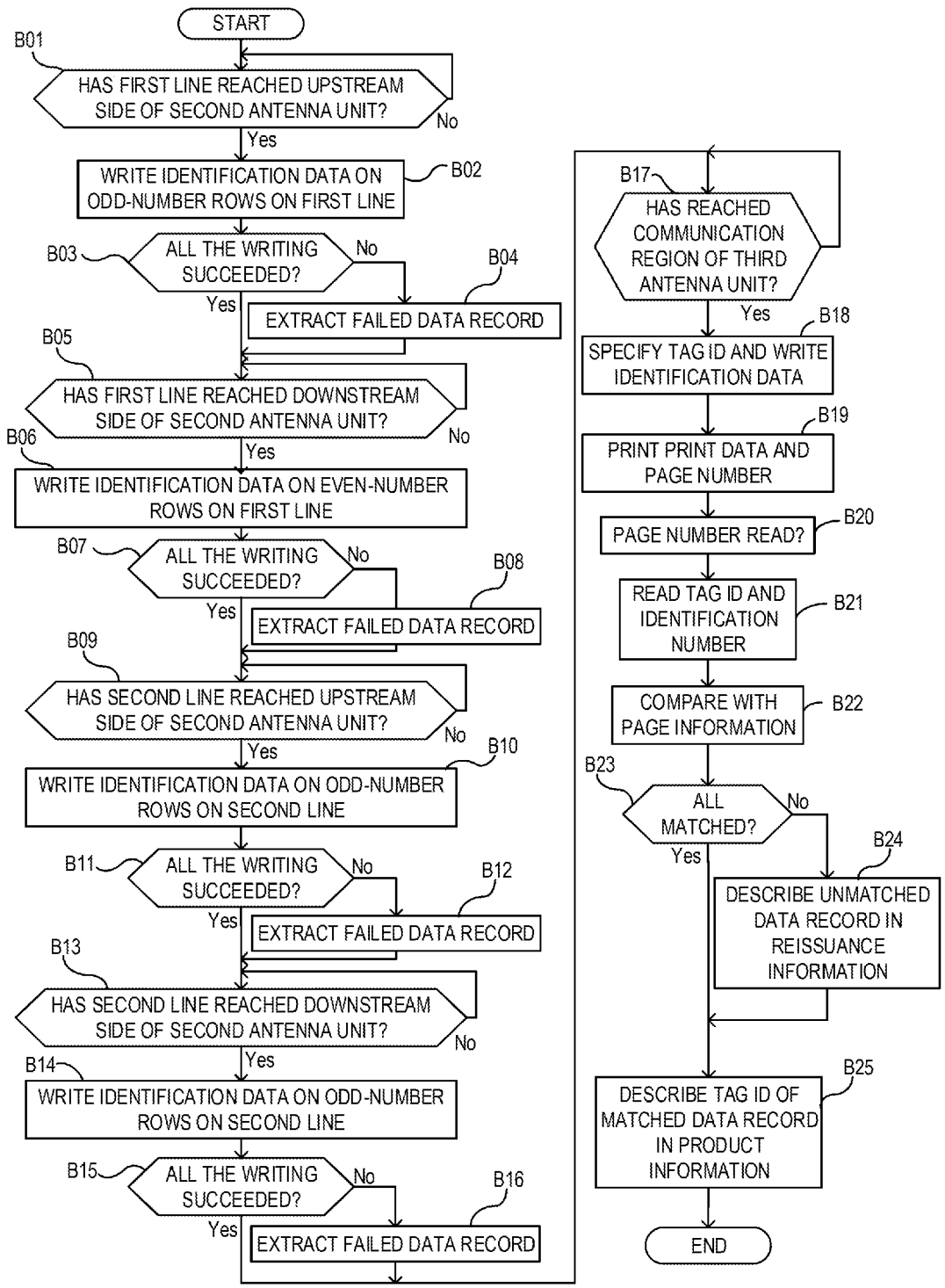
FIG. 18 is a flowchart for explaining an identification data writing operation of the embodiment of the IC tag issuing apparatus according to the present invention.

By referring to FIG. 18, the conveyance control unit 101 grasps the conveyance distance of the IC tag continuous body 1 by the detection result of the first rotary encoder unit 91 and waits for the arrival of the IC tags 10 on the first line at the row antenna units 32a to 32e located at the upstream side in the second antenna unit 32 (Step B01). Specifically, when all the loop-shaped antenna elements 14a of the IC tags 10 on the odd-number rows on the first line enter the loop-shaped antenna elements 313 of the row antenna units 32a to 32e, it is determined to be arrival.

When the IC tags 10 on the first line reach the row antenna units 32a to 32e located at the upstream side in the second antenna unit 32, the fact is notified by the conveyance control unit 101 to the writing control unit 102. The writing control unit 102 causes the identification data described in the page information to be written by the first identification data writing unit 122 to the IC tags 10 on the odd-number rows on the first line (Step B02) and determines whether or not the writing has succeeded in all (Step B03). Then, if writing in the all has not succeeded and there is the IC tag 10 which failed in writing of the identification data at Step B03, the writing control unit 102 extracts the data record including the identification data which failed to be written (tag ID and identification data) from the page information (Step B04) and temporarily stores it in the RAM or the like.

Subsequently, the conveyance control unit 101 grasps the conveyance distance of the IC tag continuous body 1 by the detection result of the first rotary encoder unit 91 and waits for the arrival of the IC tags 10 on the first line at the row antenna units 32f to 32j located at the downstream side in the second antenna unit 32 (Step B05). Specifically, when all the loop-shaped antenna elements 14a of the IC tags 10 on the even-number rows on the first line enter the loop-shaped antenna elements 313 of the row antenna units 32f to 32j, it is determined to be arrival.

When the IC tags 10 on the first line reach the row antenna units 32f to 32j located at the downstream side in the second antenna unit 32, the fact is notified by the conveyance control unit 101 to the writing control unit 102. The writing control unit 102 causes the identification data described in the page information to be written by the first identification data writing unit 122 to the IC tags 10 on the even-number rows on the first line (Step B06) and determines whether or not the writing has succeeded in all (Step B07). Then, if writing in the all has not succeeded and there is the IC tag 10 which failed in writing of the identification data at Step B07, the writing control unit 102 extracts the data record including the identification data which failed to be written (tag ID and identification data) from the page information (Step B08) and temporarily stores it in the RAM or the like.

Subsequently, the conveyance control unit 101 grasps the conveyance distance of the IC tag continuous body 1 by the detection result of the first rotary encoder unit 91 and waits for the arrival of the IC tags 10 on the second line at the row antenna units 32a to 32e located at the upstream side in the second antenna unit 32 (Step B09). Specifically, when all the loop-shaped antenna elements 14a of the IC tags 10 on the odd-number rows on the second line enter the loop-shaped antenna elements 313 of the row antenna units 32a to 32e, it is determined to be arrival.

When the IC tags 10 on the second line reach the row antenna units 32a to 32e located at the upstream side in the second antenna unit 32, the fact is notified by the conveyance control unit 101 to the writing control unit 102. The writing control unit 102 causes the identification data described in the page information to be written by the first identification data writing unit 122 to the IC tags 10 on the odd-number rows on the second line (Step B10) and determines whether or not the writing has succeeded in all (Step B11). Then, if writing in the all has not succeeded and there is the IC tag 10 which failed in writing of the identification data at Step B11, the writing control unit 102 extracts the data record including the identification data which failed to be written (tag ID and identification data) from the page information (Step B12) and temporarily stores it in the RAM or the like.

Subsequently, the conveyance control unit 101 grasps the conveyance distance of the IC tag continuous body 1 by the detection result of the first rotary encoder unit 91 and waits for the arrival of the IC tags 10 on the second line at the row antenna units 32f to 32j located at the downstream side in the second antenna unit 32 (Step B13). Specifically, when all the loop-shaped antenna elements 14a of the IC tags 10 on the even-number rows on the second line enter the loop-shaped antenna elements 313 of the row antenna units 32f to 32j, it is determined to be arrival.

When the IC tags 10 on the second line reach the row antenna units 32f to 32j located at the downstream side in the second antenna unit 32, the fact is notified by the conveyance control unit 101 to the writing control unit 102. The writing control unit 102 causes the identification data described in the page information to be written by the first identification data writing unit 122 to the IC tags 10 on the even-number rows on the second line (Step B14) and determines whether or not the writing has succeeded in all (Step B015). Then, if writing in the all has not succeeded and there is the IC tag 10 which failed in writing of the identification data at Step B15, the writing control unit 102 extracts the data record including the identification data which failed to be written (tag ID and identification data) from the page information (Step B12) and temporarily stores it in the RAM or the like.

The writing of the identification data at Steps B02, B06, B10, and B13 may be performed several times until the IC tag 10 goes out of the communication region of the row antenna units 32a to 32j (until the loop-shaped antenna elements 14a of the IC tags 10 go out of the loop-shaped antenna elements 313 of the row antenna units 32a to 32j).

The writing of the identification data at Steps B02, B06, B10, and B14 is performed to the IC tags 10 from which the tag IDs can be read and whose identification data is described in the page information. Moreover, the writing of the identification data at Steps B02, B06, B10, and B14 is performed directly without checking the tag IDs of the IC tags 10 since the target IC tag 10 is specified. Furthermore, the timing when the IC tags 10 on the first line reach the row antenna units 32f to 32j located at the downstream side in the second antenna unit 32 at Step B05 and the timing when the IC tags 10 on the second line reach the row antenna units 32a to 32e located at the upstream side in the second antenna unit 32 at Step B09 can be switched or substantially the same depending on a pitch of the IC tags 10 or a size or a layout of the row antenna units 32a to 32j. In this case, the communication is conducted at the same time in the row antenna units 32a to 32e located at the upstream side and the row antenna units 32f to 32j located at the downstream side, but since the row antenna units 32a to 32j adjacent in the diagonal direction conduct communication by using different channels, interference can be prevented and communication can be reliably conducted with the targeted IC tags 10.

Subsequently, the conveyance control unit 101 grasps the conveyance distance of the IC tag continuous body 1 by the detection result of the first rotary encoder unit 91 and waits for the arrival of the IC tags 10 in which the identification data is written at Steps B02, B06, B10, and B13 at the communication region of the third antenna unit 32 (Step B17). Then, when the IC tags 10 in which the identification data is written at Steps B02, B06, B10, and B13 reach the communication region of the third antenna unit 33, the fact is notified from the conveyance control unit 101 to the writing control unit 102. The writing control unit 102 causes the identification data to be written by the second identification data writing unit 123 to the IC tags 10 which failed writing of the identification data at Steps B02, B06, B10, and B13 (Step B18). The second identification data writing unit 123 writes the identification data to the IC tag 10 by specifying the tag ID on the basis of the data record extracted at Steps B04, B08, B12, and B16.

Since the second identification data writing unit 123 conducts communication with the IC tag 10 in the electric wave method by using the third antenna unit 33, its communication region is wider than that of the electromagnetic induction method, but since the first antenna unit 31 and the second antenna unit 32 are electromagnetically shielded except the surface faced with the IC tag continuous body 1, interference with the communication by the tag ID reading unit 121 or the first identification data writing unit 122 is prevented.

Subsequently, the conveyance control unit 101 grasps the conveyance distance of the IC tag continuous body 1 by the detection result of the first rotary encoder unit 91 and notifies the printing device 4 of the arrival of the page. Then, the printing device 4 detects a head of the page by detecting the detection mark 12 by the fourth sensor 84, prints a page number on the page, and prints the print data described in the page information on the surface of the IC tag 10 of the page, respectively (Step B19).

Subsequently, when the detection mark 12 of the page is detected by the fifth sensor 85 of the post-processing device 5, the conveyance control unit 101 notifies the detection of the detection mark 12 to the page-number reading unit 93 and the writing control unit 102 and causes the page-number reading unit 93 to read the page number printed on the page (Step B20). The reading of the page number is performed in order to specify the page. Therefore, a sign such as a barcode may be printed other than the page number so as to be read, but by printing the page number with which the user can directly recognize the page, manual inspection can be facilitated.

Subsequently, the writing control unit 102 causes the identification data reading unit 124 to read the tag ID and the identification data from the IC tag 10 of the IC tag continuous body 1 being conveyed by the fourth conveyance unit 67 by using the fourth antenna unit 51 (Step B21). Then, the writing control unit 102 compares the tag ID and the identification data read at Step B21 with the page information of the page number read by the page-number reading unit 93 (Step B22) and determines whether or not all the data records are matched (Step B23).

If there is an unmatched data record at Step B23, that is, if the identification data described in the page information could not be read or if the identification data is written to the IC tag 10 with the tag ID different from the page information, the identification data and the print data as the unmatched data record are described as reissuance information in the reissuance information storage portion 113 (Step B24). FIG. 15B illustrates an example in which the identification data described in the page information could not be read from the IC tag 10 on the fifth row on the first line and the identification data and the print data of the fifth row on the first line are described as the reissuance information.

Subsequently, as illustrated in FIG. 14B, by using the identification data as a key, the tag ID of the data record determined to be matched at Step B23 is described in the product information (Step B25), and the issuing operation for one page is finished. The issuing operation at Step A01 to Step B25 is subjected to parallel processing for each page. Then, after the issuing operation on the basis of the product information is finished, the issuing operation on the basis of the reissuance information is performed.

The writing control unit 102 notifies position information of the IC tag 10 from which the tag ID could not be read and the IC tag 10 whose identification data did not match the page information to the emboss processing unit 52. Then, the emboss processing unit 52 applies the emboss processing to and issues the IC tag 10 from which the tag ID could not be read and the IC tag 10 whose identification data did not match the page information.

As a result, when the issued IC tag continuous body 1 is cut and aligned, the IC tag 10 in which the identification data could not be correctly written can be selected easily and can be replaced by the IC tag 10 issued on the basis of the reissuance information.

In this embodiment, 10 rows*2 lines of the IC tags 10 constitute one page, but the number of rows and the number of lines constituting one page are arbitrary. In accordance with the number of rows and the size of the IC tags 10 constituting one page, the numbers and layout of the row antenna units 31a to 31j in the first antenna unit 31 and the row antenna units 32a to 32j in the second antenna unit 32 are set as appropriate.

As described above, according to this embodiment, the IC tag issuing apparatus for writing the identification data to the IC tags 10 arranged in multiple rows aligned as the IC tag continuous body 1, respectively, and issuing the result includes the second antenna units 32 arranged to face each row of the IC tags 10 in multiple rows, respectively, and functioning as a plurality of writing row antenna units for writing the identification data to the IC tags 10 by the electromagnetic induction method and a third antenna unit 33 arranged at the downstream side in the conveyance direction of the IC tag continuous body 1 from the second antenna unit 32 and functioning as the electric-wave type antenna unit for writing the identification data to the IC tags 10 by the electric wave method and is constituted to write the identification data by using the third antenna units 33 to the IC tag 10 in which the identification data could not be written by using the second antenna unit 32.

By means of this constitution, even if the IC tag 10 in which the identification data cannot be written by increasing the conveyance speed of the IC tag continuous body 1 and by using the second antenna unit 32 is generated, the identification data can be written by the third antenna unit 33 and thus, the communication processing with the IC tag can be conducted at a high speed and reliably, whereby the issuance speed can be improved.

Moreover, according to this embodiment, on the upstream side of the IC tag continuous body 1 in the conveyance direction from the second antenna unit 32, the first antenna unit 31 arranged to face each row of the IC tags 10 arranged in multiple rows, respectively, and functioning as a plurality of reading row antenna units for reading the unique tag ID from the IC tag 10 by the electromagnetic induction method is provided and it is constituted so that the identification data is written by using the second antenna unit 32 to the IC tag 10 from which the tag ID could be read by using the first antenna unit 31.

By means of this constitution, since it can be excluded from the writing targets of the identification data of the IC tag 10 from which the tag ID cannot be read, the writing efficiency of the identification data can be improved, and the issuance speed can be increased. Moreover, since the second antenna unit 32 only needs to directly write the identification data without reading the tag ID from the IC tag 10, time for writing the identification data can be reduced.

Moreover, according to this embodiment, the writing of the identification data using the third antenna unit 33 is performed by specifying the tag ID.

By means of this constitution, in writing of the identification data using the third antenna unit 33, the IC tag 10 in which the identification data could not be written by using the second antenna unit 32 can be specified in a pinpoint manner.

Moreover, according to this embodiment, in the second antenna unit 32, the surfaces other than the surface faced with the IC tag 10 of the IC tag continuous body 1 is electromagnetically shielded.

By means of this constitution, interference between the communication using the second antenna unit 32 and the communication using the third antenna unit 33 can be prevented.

Moreover, according to this embodiment, the first conveyance unit 62 and the second conveyance unit 63 are provided as the conveyance unit for conveying the IC tag continuous body 1 while suctioning it to the conveyance belts (62c, 63c), and the second antenna unit 32 is arranged to face the IC tags 10 of the IC tag continuous body 1 conveyed by the first conveyance unit 62, and the third antenna unit 33 is arranged to face the IC tags 10 of the IC tag continuous body 1 conveyed by the second conveyance unit 63.

By means of this constitution, the IC tags 10 of the IC tag continuous body 1 can conduct communication in a state reliably faced with the second antenna unit 32 and the third antenna unit 33, whereby communication accuracy can be improved.

The present invention has been described by using the specific embodiment but the aforementioned embodiment is an example, and it is needless to say that it can be changed and put into practice within a range not departing from the gist of the present invention.

REFERENCE SIGNS LIST

1 IC tag continuous body
2 placing base
3 pre-processing device
4 printing device
5 post-processing device
10 IC tag
11 sprocket hole
12 detection mark
13 inlay
13a base material
14 antenna
14a loop-shaped antenna element
14b dipole antenna element
14c meander line antenna element
15 IC chip
21 placing plate
31 first antenna unit
31a to 31j row antenna unit
32 second antenna unit
32a to 32j row antenna unit
33 third antenna unit
41 print unit
42 optical fixation unit
43 filter unit
51 fourth antenna unit
52 emboss processing unit
53 cutter member
61 first tractor feeder unit
61a driving roller
61b driven roller
61c endless belt
61d first tractor feeder driving motor
61e feed pin
62 first conveyance unit
62a driving roller
62b driven roller
62c conveyance belt
62d first conveyance belt driving motor
62e support plate
62f through hole
63 second conveyance unit
63a driving roller
63b driven roller
63c conveyance belt
63d second conveyance belt driving motor
63e support plate
63f through hole
64 second tractor feeder unit 64a driving roller
64b driven roller
64c endless belt
64d second tractor feeder driving motor
64e feed pin
65 third conveyance unit
65a driving roller
65b driven roller
65c conveyance belt
65d third conveyance belt driving motor
65e support plate
66 discharge roller
67 fourth conveyance unit
67a driving roller
67b driven roller
67c conveyance belt
67d fourth conveyance belt driving motor
67e support plate
71 first negative pressure suction unit
71a first suction fan
71b suction hole
72 second negative pressure suction unit
72a second suction fan
72b suction hole
73 third negative pressure suction unit
73a third suction fan
73b suction hole
74 fourth negative pressure suction unit
74a fourth suction fan
74b suction hole
75 fifth negative pressure suction unit
75a fifth suction fan
76 sixth negative pressure suction unit
76a sixth suction fan
77 seventh negative pressure suction unit
77a seventh suction fan
81 first sensor
82 second sensor
83 third sensor
84 fourth sensor
85 fifth sensor
86 sixth sensor
87 seventh sensor
91 first rotary encoder unit
92 second rotary encoder unit
93 page-number reading unit
101 conveyance control unit
102 writing control unit
103 print control unit
110 information storage unit
111 product information storage portion
112 page information storage portion
113 reissuance information storage portion
121 tag ID reading unit
122 first identification data writing unit
123 second identification data writing unit
124 identification data reading unit
310 shield plate
311a to 311j opening portion
312 printed board
313 loop-shaped antenna element
314 antenna terminal
315 ferrite sheet
316 antenna case
316a opening for terminal
317 screw
318 non-adhesive coating sheet

What is claimed is:

1. An IC tag issuing apparatus for writing respectively identification data to IC tags, the IC tags arranged in multiple rows aligned as an IC tag continuous body, and issuing the result, the IC tags issuing apparatus comprising:
a plurality of writing row antenna units arranged to face each row of the IC tags arranged in multiple rows, respectively, for writing the identification data to the IC tag by an electromagnetic induction method; and
an electric-wave antenna unit arranged at a downstream side in a conveyance direction of the IC tag continuous body from the plurality of writing row antenna units for writing the identification data to the IC tags by an electric wave method,
wherein the identification data is written by using the electric-wave antenna unit to the IC tags to which the identification data could not be written by using the plurality of writing row antenna units.

2. The IC tag issuing apparatus according to claim 1, further comprising:
at an upstream side of the IC tag continuous body in the conveyance direction from the plurality of writing row antenna units, a plurality of reading row antenna units respectively arranged to face each row of the IC tags arranged in multiple rows, respectively, and read a unique tag ID from the IC tags by the electromagnetic induction method; wherein
the identification data is written by using the plurality of writing row antenna units to the IC tag from which the tag ID could be read by using the plurality of reading row antenna units.

3. The IC tag issuing apparatus according to claim 2, wherein
writing of the identification data using the electric-wave antenna unit is conducted by specifying the tag ID, and the IC tag which failed in writing of the identification data using the plurality of writing row antenna units be specified.

4. The IC tag issuing apparatus according to claim 1, wherein
in the writing row antenna unit, surfaces other than the surface faced by the IC tags of the IC tag continuous body are electromagnetically shielded.

5. The IC tag issuing apparatus according to claim 2, wherein
in the writing row antenna unit, surfaces other than the surface faced by the IC tags of the IC tag continuous body are electromagnetically shielded.

6. The IC tag issuing apparatus according to claim 3, wherein
in the writing row antenna unit, surfaces other than the surface faced by the IC tags of the IC tag continuous body are electromagnetically shielded.

7. The IC tag issuing apparatus according to claim 1, further comprising:
a conveyance unit for conveying the IC tag continuous body while suctioning it to a conveyance belt is provided; and
the writing row antenna unit and the electric-wave antenna unit are arranged to face the IC tags of the IC tag continuous body conveyed by the conveyance unit.

8. The IC tag issuing apparatus according to claim 2, further comprising:
a conveyance unit for conveying the IC tag continuous body while suctioning it to a conveyance belt is provided; and the writing row antenna unit and the electric-wave antenna unit are arranged to face the IC tags of the IC tag continuous body conveyed by the conveyance unit.

9. The IC tag issuing apparatus according to claim 3, further comprising:
a conveyance unit for conveying the IC tag continuous body while suctioning it to a conveyance belt is provided; and
the writing row antenna unit and the electric-wave antenna unit are arranged to face the IC tags of the IC tag continuous body conveyed by the conveyance unit.

10. The IC tag issuing apparatus according to claim 4, further comprising:
a conveyance unit for conveying the IC tag continuous body while suctioning it to a conveyance belt is provided; and
the writing row antenna unit and the electric-wave antenna unit are arranged to face the IC tags of the IC tag continuous body conveyed by the conveyance unit.

11. The IC tag issuing apparatus according to claim 5, further comprising:
a conveyance unit for conveying the IC tag continuous body while suctioning it to a conveyance belt is provided; and
the writing row antenna unit and the electric-wave antenna unit are arranged to face the IC tags of the IC tag continuous body conveyed by the conveyance unit.

12. The IC tag issuing apparatus according to claim 6, further comprising:
a conveyance unit for conveying the IC tag continuous body while suctioning it to a conveyance belt is provided; and
the writing row antenna unit and the electric-wave antenna unit are arranged to face the IC tags of the IC tag continuous body conveyed by the conveyance unit.

* * * * *